United States Patent
Simpson et al.

(10) Patent No.: US 7,405,872 B2
(45) Date of Patent: ***Jul. 29, 2008

(54) SYSTEM AND METHOD FOR FILTERING ELECTROMAGNETIC TRANSMISSIONS

(75) Inventors: Deron Simpson, Finksburg, MD (US); Lisa Y. Winckler, Collinsville, VA (US)

(73) Assignees: ASTIC Signals Defenses LLC, Baltimore, MD (US); CPFilms, Inc., Fieldale, VA (US)

( * ) Notice: Subject to any disclaimer, the term of this patent is extended or adjusted under 35 U.S.C. 154(b) by 279 days.

This patent is subject to a terminal disclaimer.

(21) Appl. No.: 11/033,298

(22) Filed: Jan. 12, 2005

(65) Prior Publication Data

US 2005/0134959 A1    Jun. 23, 2005

Related U.S. Application Data

(63) Continuation-in-part of application No. 10/445,942, filed on May 28, 2003.

(51) Int. Cl.
*F21V 9/04* (2006.01)
(52) U.S. Cl. ............ 359/359; 359/361; 359/585; 359/590; 359/900
(58) Field of Classification Search ......... 359/359, 359/360
See application file for complete search history.

(56) References Cited

U.S. PATENT DOCUMENTS 5,811,923 A * 9/1998 Zieba et al. ............ 313/479

* cited by examiner

*Primary Examiner*—Fayez G. Assaf
(74) *Attorney, Agent, or Firm*—Hogan & Hartson LLP

(57) ABSTRACT

A combination of filters for filtering selected wavelengths of electromagnetic radiation is provided on a transparent substrate such as a plastic film or glazing of a window. The combination of filters prevents or attenuates the passage of wavelengths through the substrate into a building, where the passage of the wavelengths into the building could adversely affect people or machinery within the building. The combination of filters is useful improve wireless networks performance by blocking or attenuating undesired electromagnetic interference, and radio frequency interference.

28 Claims, 9 Drawing Sheets

SYSTEM AND METHOD FOR FILTERING ELECTROMAGNETIC TRANSMISSIONS

CROSS REFERENCE TO RELATED APPLICATIONS

The present invention is a continuation in part to pending U.S. application Ser. No. 10/445,942 (U.S. Patent Application Publication No. 2003-0232181), filed on May 28, 2003 and entitled System And Methods For Filtering Electromagnetic Visual, And Minimizing Acoustic Transmissions.

STATEMENT REGARDING SPONSORED RESEARCH OR DEVELOPMENT

Not Applicable.

REFERENCE TO SEQUENCE LISTING

Not Applicable.

BACKGROUND OF THE INVENTION

1. Field of the Invention

The invention relates to a system and method for filtering electromagnetic and visual transmissions, and for minimizing acoustic transmissions for security purposes. More specifically, the invention provides a system and method to prevent unauthorized data collection and information exchange from or within buildings (such as through windows, doorways, other fenestration, or openings) or otherwise prevent such unauthorized data collection and information exchange from, for example, computer monitors or screens, personal digital assistants, and local area networks.

2. Discussion of Related Art

Electromagnetic radiation of various frequencies is radiated from many devices used in a wide range of facilities including homes, workplaces such as offices, manufacturing and military installations, ships, aircraft and other structures. Examples of such devices include computers, computer monitors, computer keyboards, radio equipment, communication devices, etc. If this radiation escapes from the facility, it can be intercepted and analyzed for the purpose of deciphering data associated with or encoded in the escaped radiation. For example, technology exists for reconstructing the image appearing on a computer monitor in a building from a remote location outside the building or from a location within a building by detecting certain wavelength frequencies from the monitor screen even if the monitor screen is not in view from the remote location. This is accomplished by known techniques wherein certain frequencies of light from the monitor screen, even after being reflected from various surfaces inside the building or room where the monitor is located, escape and are intercepted and analyzed by an eavesdropper in another location outside the building or room where the monitor is located. Obviously, the ability of an eavesdropper to intercept such radiation constitutes a significant security risk, which is desirably eliminated from facilities where secrecy is essential.

Although walls, such as brick, masonry block or stone walls may effectively prevent the escape of light frequencies from a facility, radio frequencies pass through walls that are not properly grounded to prevent such passage. Moreover, windows or other openings allow the passage of radiation to the outside where it can be intercepted, and permit entry of various forms of radiation, such as laser beams, infrared, and radio frequencies, into the facility. As a result, sensitive or secret data may be gathered from within the structure.

Indeed, the United States Government has long been concerned by the fact that electronic equipment, such as computers, printers, and electronic typewriters, give off electronic emanations. The TEMPEST (an acronym for Transient Electromagnetic Pulse Emanation Standard) program was created to introduce standards that would reduce the chances of leakage of emanations from devices used to process, transmit, or store sensitive information. This is typically done by either designing the electronic equipment to reduce or eliminate transient emanations, or by shielding the equipment (or sometimes a room or entire building) with copper or other conductive materials. Both alternatives can be extremely expensive.

The elimination of windows and other openings from a structure would obviously minimize the above-noted security risk. The disadvantages of a windowless or enclosed structure, however, are self-evident. It would be highly desirable, therefore, to prevent the escape of radiation associated with data through windows, doorways, or other openings while allowing other radiation to pass there-through so that the enjoyment of the visual effects provided by such openings can be obtained without an undue security risk.

In addition to the security risks associated with the passage of certain wavelengths of electromagnetic radiation, acoustic transmission through a window, door or other opening also poses a security risk. It would be of additional benefit if transmission of both acoustic and the aforementioned electromagnetic radiation through openings could be minimized or avoided while preserving the visual benefits provided thereby.

The need for reducing the undesirable effects of the sun—its heat, excessive energy usage, glare, and ultraviolet (UV) radiation—has led to the development of solar control window films. Solar control window films are thin polyester sheets, which are mounted on the glass windows of buildings and automobiles via an adhesive. It is said that such films are effective in providing comfort, visibility, and increased energy efficiency.

In the current workplace or home environment, however, there is a need for more protection than solar control films can provide. For example, it is important to protect the work product of an individual, business, or other entity from unauthorized data collection through the glass windows or other openings of their offices. The conventional solar control films described above are, for the most part, incapable of rejecting the wide range of frequencies used for such unauthorized data and information exchange.

Given the importance of security in today's competitive marketplace, a system that could preserve the privacy of the workplace is very desirable. Such a system would provide both comfort and security, which in turn can bring about many benefits, including increased productivity and the preservation of confidentiality in both the public and private sectors.

SUMMARY OF THE INVENTION

Accordingly, the present invention provides a system and method for filtering electromagnetic, visual, and minimizing acoustic transmissions by using a combination of filters which substantially obviates one or more of the problems due to the limitations and disadvantages of the related art. The invention further provides a system and methods whereby a combination of films has a shielding effectiveness which attenuates the transmission of radio frequency wavelengths there-through and provides effective filtering of UV and IR light with good visible light transmission (VLT) without undesirable color characteristics.

To achieve these and other advantages and in accordance with the purpose of the present invention, as embodied and broadly described, the system and methods of the present invention include a combination of electromagnetic radiation filters, such as selective radiation absorbers and/or selective radiation reflectors. These may be part of a window. The system and methods according to the invention have, however, non-exclusionary applications; the invention can be interposed between glass surfaces or applied to every type of glazing. The system and methods according to the invention can also be used for free standing product application for computer screens, monitors and other stand-alone devices. Further, the system and methods according to the invention may be configured to form a separate covering, which may be placed over computer screens, monitors and other stand-alone devices. The example of windows discussed herein is employed for convenience and is not intended to be limiting as to surface application.

The radiation filters of the combination may be individual or combined layers plied to a window in any sequence so that light, which passes through the window, passes through the radiation filters used in the combination. The radiation filters may be applied on any surface of the glazing (i.e., glass or other transparent material used for windows) of the window to form a multilayered structure of the filters on the glazing. It is not essential for all the layers to be contiguous to each other on one surface of the glazing. Instead, the filters may be distributed in any manner over or in the glazing of a window so as to prevent the passage of the wavelengths which would pose a security risk if they were allowed to pass through the window. For example, one filter may be on one surface of a glass pane while the remaining filters may be distributed as a single or multilayer structure on another surface of the glass layer (e.g., glass pane) or the filters may be distributed on any of the surfaces of a plurality of glass layers of a window (e.g., a multi-glazed window structure such as a double or triple glazed window structure).

In addition, any or all of the filters may be used in conjunction with a conventional glass interlayer such as the glass interlayer used in conventional safety glass which comprises a plastic interlayer such as polyvinylbutyral (PVB) interposed between two glass layers. The filters may be incorporated in, deposited on, or laminated to or within the interlayer in which case the filters will be within the glazing of the window.

Each filter of the combination of filters is advantageously in the form of an individual layer or coating, but this is not essential. In the case of filters which are absorbers (filters which use a particular dye, metal, metal salt or pigment to absorb a desired wavelength or range of wavelengths), the entire combination of absorbers or a portion of the combination may be in the form of a mixture of dyes, metal, metal salt or pigments in a single layer as a coating or may be incorporated in a component of the window such as in the polyvinylbutyral interlayer used in safety glass or in an adhesive layer used to adhere film, sheets or the like to the glass. It is also possible to incorporate one or more of the absorbers as a mixture in a film or sheet attached to the window or as layers applied to or coated onto a film or sheet. The PVB layer or the adhesive layer may include electrically conductive particles therein in an amount to render the PVB or the adhesive conductive.

The film or sheet may be any of the films or sheets used to make conventional solar control films. An example of a film used for this purpose includes, polyethylene terephthalate (PET), but others may be used as well.

When a film or sheet is used in combination with glass, it is not essential for the entire combination of filters to be in or on the film or sheet. For example, one or more filters may be associated with the film or sheet as described above while any remaining filters may be connected to the glass as described above or vice versa. It is also possible to include a layer which comprises a mixture of absorbers with another layer which is a different filter to make the desired combination. For example, two absorbers such as dyes or pigments of the combination may be used as a mixture as two filters of the combination, and another filter of the combination may be in the form of a distinct layer or coating such as a metal reflecting or absorbing layer.

Moreover, it is not essential for the entire combination of filters to be distributed on the same surface. For example, one or more of the filters may be applied to the glazing of a window while remaining filters may be applied to computer screens or monitors, personal digital assistants, or other stand-alone devices.

It is also not essential for the combination of filters to be attached to a surface of a window, computer screen or monitor, personal digital assistant or other stand-alone device. For example, the combination of filters may be configured to form a separate covering, which may be soft and pliable, such as a bag. In this embodiment the combination of filters may be advantageously attached to a clear or transparent flexible substrate (e.g., PET sheet or film) which may be configured into the shape of a bag. When configured as a separate covering such as a bag, the combination of filters may be placed over computer screens or monitors, personal digital assistants, or other stand-alone devices, may be easily used and removed, and preferably may be disposable. Alternatively, the separate covering may be in the form of a tent or sheet, thereby covering an entire workstation, such as an outdoor or mobile workstation.

Any coatings, layers, films, sheets, lamina or the like used in this invention may be applied to a component of the window (e., the glass or interlayer component) by techniques which are conventional and well known to those skilled in the art. For example, metal layers may be applied by conventional sputtering techniques or evaporative coatings techniques. Any of the various layers may be adhered to the glass by means of conventional adhesives.

Although glass is described herein as the typical material which is used to make a window, it is to be understood that other clear or transparent materials which are useful for making windows may be substituted for the glass. For example hard plastics such as polycarbonate, plexiglass, acrylic plastic, etc., may be used as a substitute for the glass.

In view of the above, it will be appreciated by one skilled in the art that the required combination of filters may be associated with the window in any manner or sequence providing they are configured to prevent passage of the critical wavelengths there-through for achieving the above-described security feature. Optionally additional conventional components or layers may be applied to the window to improve the aesthetics and/or visual characteristics of the window or to provide additional solar control, anti-reflection or radiant heat exclusion or safety and security characteristics in accordance with known techniques.

The desired effect of the present invention (i.e., filtering the passage of certain wavelengths through the window) can be achieved with any type of light filter or light valve which prevents the passage of the selected wavelengths. Thus, for example, the light filters or light valves used in this invention may be any of the absorbers described above or any other type of light filter or light valve such as a wavelength selective reflective layer or any combination of different types of light filters and light valves. For example, light absorbers may be combined with reflective layers.

It will be appreciated that the filters used in this invention are selective with respect to the wavelengths being filtered and thus the glazing remains sufficiently transparent for use as a window. Sufficient transparency is achieved by allowing visible light transmission of at least 1%, although higher visible light transmission of at least about 25-30% is preferred, with 50%-70% being more preferred.

The combination of filters are advantageously connected to a transparent substrate and are configured so as to exclude the passage of the selected wavelengths there-through, such as by absorption and/or reflection of the selected wavelengths. Thus, uncoated or exposed areas, which would permit the passage of the selected wavelengths, should be avoided.

Although the filters are connected to the substrate, each filter does not have to be directly connected to the substrate. In other words, the connection of a filter layer may be made by connecting the filter layer to another filter layer which was previously connected to the substrate so that one filter layer is connected to the substrate via another filter layer. For example, when two filter layers are located on one side of the substrate, one filter layer is directly connected to the substrate while the other filter layer is connected to the substrate via the first filter layer (i.e., indirectly connected). The same applies in instances where more than two filter layers are connected to one side of the substrate. In other words, being connected to the substrate in this invention is intended to cover both direct and indirect connections. Also, when a filter is formed by mixing or impregnating absorbents such as dyes or pigments into a component, the filter comprised of dye and/or pigment is considered in the context of this invention as being connected to the component.

Instead of coating the filter as a layer on the substrate, the filter may be connected to the substrate by a lamination process wherein a previously formed filter layer is laminated onto the substrate either directly or indirectly.

The substrate may be the glazing of the window or may be a flexible transparent sheet (e.g., plastic sheets such as PET) which is then connected to the glazing. A portion of the combination of filters may be connected to the glazing and another portion of the combination of filters may be connected to one or more flexible transparent sheets, which are connected to the glazing. Alternatively the flexible transparent substrate with the combination of filters attached thereto may be configured as a bag to contain a computer screen or monitor, personal digital assistant or other stand alone device placed therein. Preferably the bag is sealed or tightly closed with the computer screen or monitor, digital assistant or other stand alone device therein so that the wavelengths to be filtered will not escape from the bag. The flexible substrate with the combination of filters attached thereto may also be configured as a tent for temporary field applications so that personnel and the computer screen or monitor, etc., may be inside the tent. In use the tent should cover the personnel and equipment inside to prevent leakage of the wavelengths which are to be filtered.

All of the filters do not have to be applied to a single substrate. For example, in a multi-glazed window, the combination of filters may be distributed on one or more of the glass sheets of the glazing either as a coating or layer on the glass and on one or more sheets connected to the glass.

At least one of the filters may be advantageously electrically conductive to inhibit the passage of radio waves through the window.

The substrate may include other conventional solar control elements such as light absorbing layers, anti-reflecting layers, or reflectors thereon.

The system and method may also be used as a Glass-fragmentation Safety Film and, as such, may be used to minimize flying glass fragments in real world situations. To accomplish this objective the flexible sheet may include one or more layers which inhibit glass fragments from becoming dangerous flying projectiles when the window breaks due to explosion, implosion, or due to force from a projectile. A suitable layer for this purpose is polyester film (e.g., PET) or other flexible clear film. For example a 7 mil thick PET film is adequate for this purpose. The PET film may be adhered to the film containing the combination of filters with an adhesive (e.g., a pressure sensitive adhesive such as a acrylic pressure sensitive adhesive or any of the other adhesives described herein). A suitable acrylic pressure sensitive adhesive includes Gelva 263 available from UCB Inc. which includes 8% by weight of benzophenone type UV absorber for light stability. The pressure sensitive adhesive may be coated at a rate of 4 lbs. per ream coat rate.

The film used to provide glass fragmentation protection should be located on the glass surface of a window which is in the interior of the building to prevent glass fragments from causing injury to occupants in the building.

The invention encompasses an improved combination of filters which provides high visible light transmission and low electrical resistance (less than 4 ohms/square) for enhanced attenuation of electromagnetic interference (EMI) and enhanced attenuation of radio frequency interference (RFI) as well as effective filtering of UV and IR light. Some embodiments of the improved combination of filters provided by this invention are particularly useful for shields which are applied to plasma display screens and other display screens which emit large amounts of EMI/RFI, UV light or IR light. The shields provide the monitor with a security feature which is useful for preventing unauthorized surveillance of the display screen.

The invention also provides for the selection of various combinations of filters to customize the anti-surveillance security features to suit a particular need. This is because the combination of filters which affords the highest level of anti-surveillance security typically produces light transmission characteristics which are not aesthetically pleasing when used on a window. Not everyone needs such a high level of security which would necessitate compromising visual aesthetics. For many applications, e.g., business and home use, it may be desirable to provide an acceptable level of security for many applications without compromising visual aesthetics.

A combination of filters for filtering selected wavelengths of electromagnetic radiation is provided on a transparent substrate such as a plastic film or glazing of a window. The combination of filters prevents or attenuates the passage of wavelengths through the substrate into a building, where the passage of the wavelengths into the building could adversely affect people or machinery within the building. The combination of filters is useful improve wireless networks performance by blocking or attenuating undesired electromagnetic interference, and radio frequency interference.

BRIEF DESCRIPTION OF THE DRAWINGS

The accompanying drawings, which are included to provide further understanding of the invention and are incorporated in and constitute a part of this specification, illustrate embodiments of the invention and together with the description, serve to explain the principles of the invention.

DETAILED DESCRIPTION OF THE INVENTION AND PREFERRED EMBODIMENTS

Reference will now be made in detail to embodiments of the present invention, examples of which are illustrated in the accompanying drawings.

Figure 1:
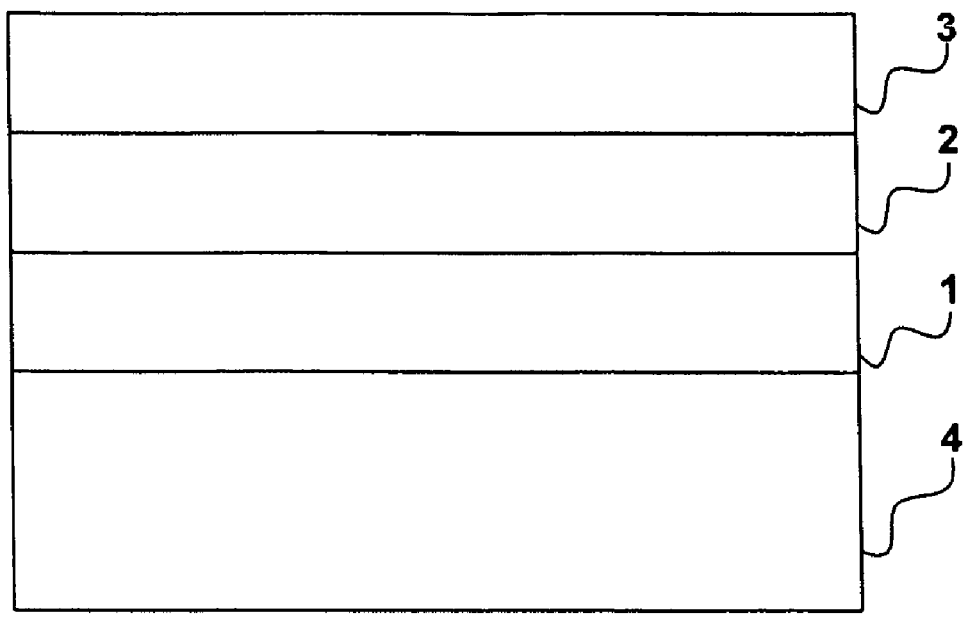
FIG. 1 is a cross-sectional view of a combination of three light filters of the present invention connected to a substrate.

As noted above, the light filters may be sequenced or distributed in any manner. FIG. 1 illustrates an embodiment wherein film layers 1, 2 and 3 (which are light filters used in the present invention) are connected to one side of substrate 4.

Figure 2:
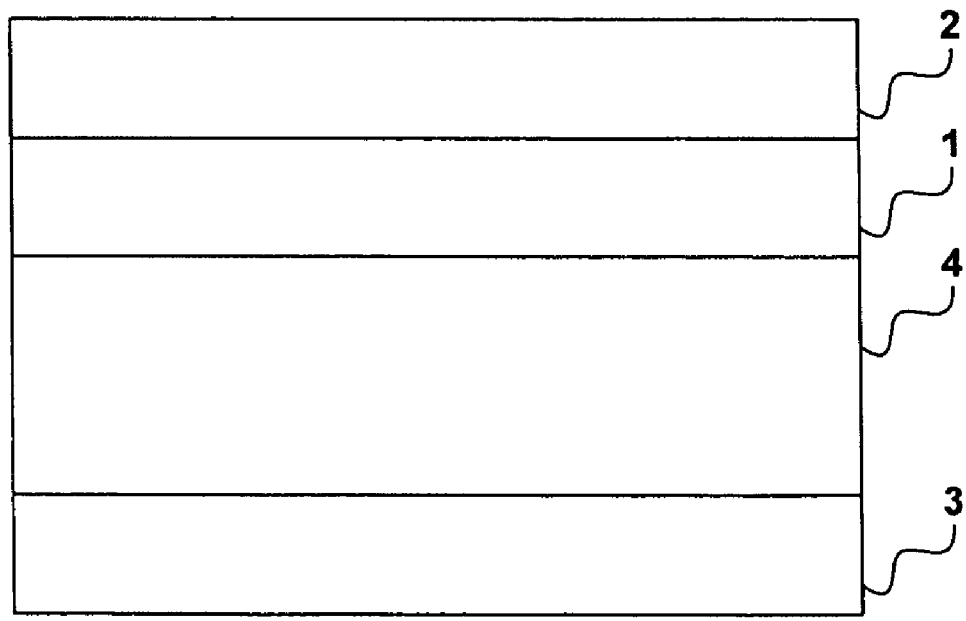
FIG. 2 is a cross-sectional view of an embodiment of the invention wherein two light filters of the invention are connected to one side of the substrate and the third filter of the invention is attached to another side of the substrate.
Figure 3:
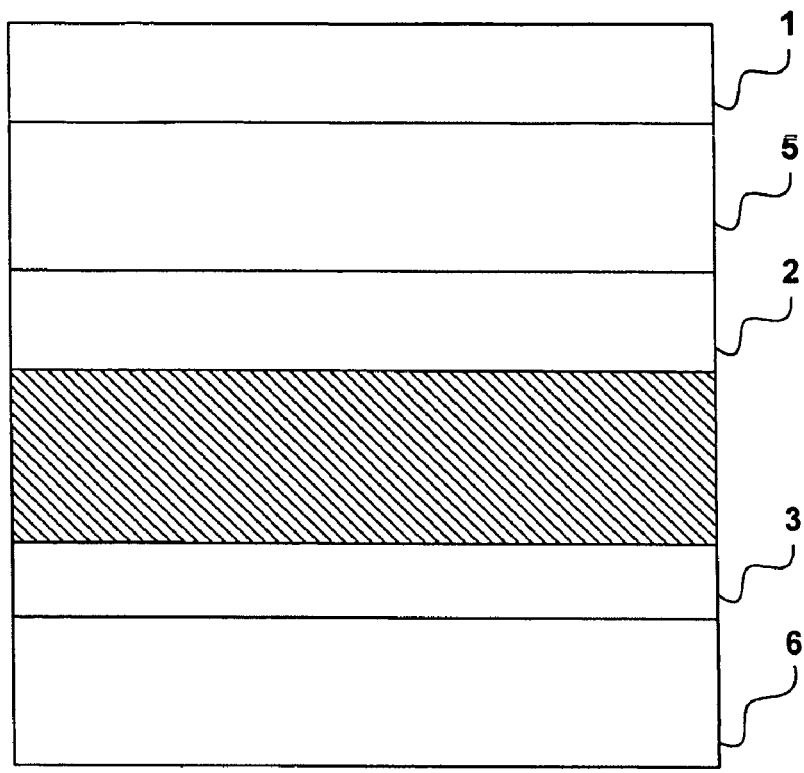
FIG. 3 is a cross-sectional view showing an embodiment of the invention which utilizes a double glazed window.
Figure 4:
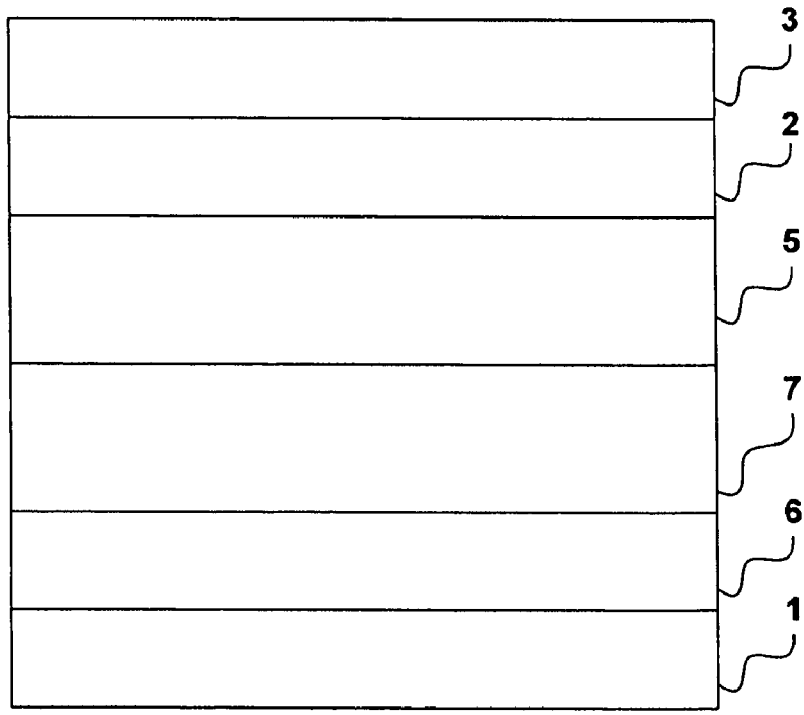
FIG. 4 is a cross-sectional view of an embodiment of the invention which includes a plurality of light filters attached to conventional safety glass.

FIG. 2 illustrates an alternative embodiment wherein film layers 1 and 2 are connected to one side of the substrate 4 while film layer 3 is connected to the other side of substrate 4. In a further embodiment illustrated in FIG. 3, the window glazing which serves as the substrate comprises two separate spaced-apart glass sheets 5 and 6. Film layers 1 and 2 are attached to either side of glass sheet 5 while film layer 3 is attached to glass sheet 6. Film layer 3 in FIG. 3 may be attached to either side of sheet 6. In a further embodiment illustrated in FIG. 4, the substrate upon which the films are connected may be a standard safety glass which includes PVB interlayer 7 interposed between glass sheets 5 and 6. Film layers 3 and 2 are connected to glass sheet 5 and film layer 1 is connected to glass sheet 6. It is also possible to connect any or all of film layers 1, 2 and 3 to PVB interlayer 7.

The above described versatility concerning the sequence and distribution of a combination of three light filters used in the present invention is also applicable to other embodiments of the invention which use less or more than 3 light filters in the combination.

One of the light filters of the combination may be a metal or a metal stack comprising an electrically conductive metal layer which is optionally interposed between two nickel/chrome alloy layers. The electrically conductive metal layer preferably has at least the electrical conductivity of aluminum or higher, and more preferably has at least the electrical conductivity of copper or higher. Most preferably the electrically conductive metal is copper. The nickel chrome alloy is utilized to provide corrosion protection for the electrically conductive metal and may be omitted if the anti-corrosion benefit is not desired. Other anti-corrosion metals or metal alloys such as stainless steel may be substituted for one or both the nickel/chrome alloy layers. It is also possible to provide the nickel/chrome alloy or an anti-corrosion metal or metal alloy on only one side of the electrically conductive metal layer. The nickel/chrome alloy layers may include a Hastelloy alloy or an Inconel alloy, which are well known to those skilled in the art. An example of a Hastelloy alloy includes Hastelloy C276, which has the characteristics shown in Table 1:

TABLE 1

Chemical composition, percent by weight: C, 0.02$^a$, Mn, 1.00$^a$; Fe, 5.50; S, 0.03$^a$; Si, 0.05$^a$; Cr, 15.50; Ni, balance; Co, 2.50$^a$; Mo, 16.00; W, 3.75; V, 0.35$^a$; P, 0.03$^a$ Maximum
Physical constants and thermal properties
Density, lb/in.$^3$: 0.321
Coefficient of thermal expansion, (70-200° F.) in./in./° F. × 10$^{-6}$: 6.2
Modus of elasticity, psi: tension, 29.8 × 10$^6$
Melting range, ° F.: 2,415-2,500 Specific heat, Btu/lb/° F., 70° F.: 0.102
Thermal conductivity, Btu/ft2/hr/in./° F., 70° F.: 69
Electrical resistivity, ohms/cmil/ft, 70° F.: 779
Heat Treatments
Solution heat treat 2,100° F., rapid quench.

TENSILE PROPERTIES
Solution Treated 2,100° F., Water Quench

| Temperature, ° F. | T.S., psi | Y.S., psi, 0.2% offset | Elong., in 2 in. % | Hardness, Brinell |
|---|---|---|---|---|
| 70 | 113,500 | 52,000 | 70 | — |
| 400 | 101,700 | 44,100 | 71 | — |
| 600 | 95,100 | 39,100 | 71 | — |
| 800 | 93,800 | 33,500 | 75 | — |
| 1,000 | 89,600 | 31,700 | 74 | — |
| 1,200 | 86,900 | 32,900 | 73 | — |
| 1,400 | 80,700 | 30,900 | 78 | — |
| 1,600 | 63,500 | 29,900 | 92 | — |
| 1,800 | 39,000 | 27,000 | 127 | — |

Rupture Strength, 1,000 hr
Solution Treated, 2,100° F., Water Quench

| Test Temperature, ° F. | Strength, psi | Elong., in 2 in., % | Reduction of area, % |
|---|---|---|---|
| 1,200 | 40,000 | — | — |
| 1,400 | 18,000 | — | — |
| 1,600 | 7,000 | — | — |
| 1,800 | 3,100 | — | — |

TABLE 1-continued

Impact Strength
Solution Treated, 2,100° F., Water Quench

| Test temperature, ° F. | Type test | Strength, ft-lb |
|---|---|---|
| −320 | Charpy-V-notched | 181 |
| +70 | Charpy-V-notched | 238 |
| +392 | Charpy-V-notched | 239 |

An example of an Inconel alloy includes Inconel 600 which has the characteristics shown in table 2.

TABLE 2

Chemical composition, percent by weight: C, 0.08; Mn, 0.5; Fe, 8.0; S, 0.008; Si, 0.25; Cr, 15.5; Ni, 76.0 Cu, 0.25; Ti, 0.35; Al, 0.25
Physical constants and thermal properties
Density, lb/in.$^3$: 0.304
Coefficient of thermal expansion, (70-200° F.) in./in./° F. × 10$^{-6}$: 7.4
Modulus of elasticity, psi: tension, 30 × 10$^6$; torsion, 11 × 10$^6$
Poisson's ratio: 0.29
Melting range, ° F.: 2,470-2,575
Specific heat, Btu/lb/° F., 70° F.: 0.106
Thermal conductivity, Btu/Ft$^2$/hr/in./° F., 70° F.: 1
Electrical resistivity, ohms/cmil/ft, 70° F.: 620
Curie temperature, ° F.: annealed, −192
Permeability (70° F., 200 Oe): annealed, 1.010
Heat treatments used in annealed condition, 1,850° F./30 min.

Tensile Properties
Hot Rolled

| Temperature, ° | T.S., psi | Y.S., psi, 0.2 offset | Elong. in 2 in. % | Hardness, Brinell |
|---|---|---|---|---|
| 70 | 90,500 | 36,500 | 47 | — |
| 600 | 90,500 | 31,100 | 46 | — |
| 800 | 88,500 | 29,500 | 49 | — |
| 1,000 | 84,000 | 28,500 | 47 | — |
| 1,200 | 65,000 | 26,500 | 39 | — |
| 1,400 | 27,500 | 17,000 | 46 | — |
| 1,600 | 15,000 | 9,000 | 80 | — |
| 1,800 | 7,500 | 4,000 | 118 | — |

Rupture Strength, 1,000 hr
Solution Annealed, 2,050° F./2 hr

| Test Temperature, ° F. | Strength, psi | Elong., in 2 in., % | Reduction of area, % |
|---|---|---|---|
| 1,500 | 5,600 | — | — |
| 1,600 | 3,500 | — | — |
| 1,800 | 1,800 | — | — |
| 2,000 | 920 | — | — |

Creep Strength (Stress, psi, to Produce 1% Creep)
Solution Annealed 2,050° F./2 hr.

| Test Temperature, ° F. | 10,000 hr | 100,000 hr |
|---|---|---|
| 1,300 | 5,000 | — |
| 1,500 | 3,200 | — |
| 1,600 | 2,000 | — |
| 1,700 | 1,100 | — |
| 1,800 | 560 | — |
| 2,000 | 270 | — |

TABLE 2-continued

Fatigue Strength
Annealed

| Test temperature, ° F. | Stress, psi | Cycles to failure |
|---|---|---|
| 70 | 39,000 | 108 |

Impact Strength
Annealed

| Test temperature, ° F. | Type test | Strength, ft-lb |
|---|---|---|
| +70 | Charpy-V-notched | 180 |
| 800 | Charpy-V-notched | 187 |
| 1,000 | Charpy-V-notched | 160 |

Another light filter which may be used in this invention includes a heat reflecting film. The heat reflecting film may be a sputtered metal/oxide stack described in U.S. Pat. No. 6,007,901 on a polyester (PET) film with UV absorbers dyed into it at 2.4 absorbance manufactured by the dyeing process described in U.S. Pat. No. 6,221,112. The disclosures of the aforementioned U.S. Pat. Nos. 6,007,901 and 6,221,112 are incorporated herein by reference. Alternatively any of the heat reflecting metal/oxide stacks described herein may be coated onto any component of window glazing to thereby eliminate the need of a plastic film. In other words the metal/oxide stack may be deposited onto any component of window glazing (e.g., coated directly or indirectly onto the glass of window glazing) without first coating the metal/oxide stack onto a film (e.g., polyester film) and then adhering the metal/oxide coated film onto the window glazing.

Any of the heat reflecting films which are well known to those skilled in the art may be used in this invention. Such heat reflecting films generally comprise multiple stacks of discrete layers which are deposited onto a substrate such as a plastic film or glass. Each stack has in sequence a thin film of dielectric material (e.g., metal oxide) and a heat reflecting metal such as silver, gold, copper or alloys thereof. Substantially transparent conductive metal compounds (e.g., metal oxides) such as indium tin oxide may be used as the dielectric.

The heat reflecting film may comprise in sequence: (a) a substantially transparent substrate; (b) a first outer dielectric layer; (c) an infrared reflecting metal layer; (d) a color correcting metal layer comprising a metal different from the infrared reflecting metal layer; (e) a protective metal layer comprising a metal different from the infrared reflecting metal layer and different from the color correcting layer; (f) one or more subcomposite layers each comprising: (i) a subcomposite inner dielectric layer; (ii) a subcomposite infrared reflecting metal layer; (iii) a subcomposite color correcting metal layer comprising a metal different from the subcomposite infrared reflecting metal layer; and (iv) a subcomposite protective metal layer comprising a metal different from the subcomposite infrared reflecting metal layer and different from the subcomposite color correcting metal layer; and (g) a second outer dielectric layer.

The dielectric layers are typically indium oxide, indium zinc oxide, indium tin oxide or mixtures thereof. However other metal oxides may be substituted for the above-mentioned oxides. Suitable oxides for use as the dielectric layer include metal oxides having an index of refraction in the range of 1.7-2.6. The thickness of the outside dielectric layers is typically between about 0.15 quarter wave optical thickness and about 1 quarter wave optical thickness.

The infrared reflecting metal layers are typically silver, gold, copper or alloys thereof and are laid down in a thickness of between 7 nm and about 25 nm. The color correcting metal layers preferably have a refractive index between about 0.6 and about 4 and an extinction coefficient for light in the visible range between about 1.5 and about 7. The color correcting metal layers most preferably consist essentially of indium.

The protective metal layers are made from a metal whose oxide is substantially-optically non-absorbing, such as aluminum, titanium, zirconium, niobium, hafnium, tantalum, tungsten and alloys thereof. The protective metal layers typically have a thickness between about 1 nm and about 5 nm.

The heat reflecting film may also be a composite comprising in sequence: (a) a substantially transparent substrate; (b) a first outer dielectric layer; (c) an infrared reflecting metal layer; (d) a color correcting metal layer comprising a metal different from the infrared reflecting metal layer; (e) a protective metal layer comprising a metal different from the infrared reflecting metal layer and different from the color correcting layer; (f) a second outer dielectric layer; and (g) a substantially transparent top layer comprising a substantially transparent glass or polymeric material.

The heat reflecting film may also be a composite comprising in sequence: (a) a substantially transparent substrate; (b) a first outer dielectric layer chosen from the group of dielectric materials consisting of indium oxide, indium zinc oxide, indium tin oxide and mixtures thereof; (c) an infrared reflecting metal layer comprising an alloy of silver and copper; (d) a color correcting metal layer consisting essentially of indium; (e) a protective metal layer comprising a metal whose oxide has a heat of formation less than (more negative than) −100,000 cal/gm mole at 25 degree. C.; and (f) a second outer dielectric layer chosen from the group of dielectric materials consisting of indium oxide, indium zinc oxide, indium tin oxide and mixtures thereof.

Preferably the various layers of the heat reflecting film are assembled so as to transmit between about 40% and about 80% of light within the visible spectrum (preferably 40-60%). It is also preferable that the composites of the heat reflecting film have reflectances of visible light less than 15%, typically between about 5% and 15%. Finally, it is preferable that the layers of the heat reflecting film be so assembled so that the composite transmits and reflects visible light in "neutral colors" or "slightly blueish or greenish" transmission colors. Transmissions which are neutral in color are those which transmit visible light in equal intensities throughout the visible spectrum. Light transmitted with a slightly blueish or slightly greenish tint is light whose components with wave lengths in the 380-580 nm range are slightly higher in intensity than other wave lengths.

According to one embodiment the heat reflecting film comprises in sequence: a) a substantially transparent first substrate; (b) a first outer dielectric layer; (c) an infrared reflecting metal layer; (d) a color correcting metal layer comprising a metal different from the infrared reflecting metal layer; (e) a protective metal layer comprising a metal different from the infrared reflecting metal layer and different from the color correcting layer; (f) a subcomposite comprising: (i) a subcomposite inner dielectric layer; (ii) a subcomposite infrared reflecting metal layer; (iii) a subcomposite color correcting metal layer comprising a metal different from the subcomposite infrared reflecting metal layer; and (iv) a subcomposite protective metal layer comprising a metal different from the subcomposite infrared reflecting metal layer and different from the subcomposite color correcting layer; (g) a second outer dielectric layer; and (h) a substantially transparent second substrate; wherein the heat reflective filter transmits 40-80% of light within the visible wavelengths (preferably 60-70%) and has a reflectance of less than 15%; and wherein the color of both transmitted and reflected light from the heat reflecting fenestration product is either neutral or is slightly blueish or slightly greenish in color.

In another embodiment the heat reflecting composite comprises in sequence: (a) a substantially transparent first substrate; (b) a first outer dielectric layer; (c) an infrared reflecting metal layer comprising silver; (d) a color correcting metal layer comprising a metal chosen from the group of metals consisting of chromium, cobalt, nickel, zinc, palladium, indium, tin, antimony, platinum, bismuth and alloys thereof; (e) a protective metal layer comprising a metal chosen from the group of metals consisting of aluminum, titanium, zirconium, niobium, hafnium, tantalum, tungsten and alloys thereof; (f) a subcomposite comprising: (i) a subcomposite inner dielectric layer; (ii) a subcomposite infrared reflecting metal layer comprising silver; (iii) a subcomposite color correcting metal layer comprising a metal chosen from the group of metals consisting of chromium, cobalt, nickel, zinc, palladium, indium, tin, antimony, platinum, bismuth and alloys thereof; (iv) a subcomposite protective metal layer comprising a metal chosen from the group of metals consisting of aluminum, titanium, zirconium, niobium, hafnium, tantalum, tungsten and alloys thereof; (g) a second outer dielectric layer; and (h) a substantially transparent second substrate disposed contiguous with the second outer dielectric layer; wherein the dielectric layers are chosen from the group of dielectric materials consisting of indium oxide, indium zinc oxide, indium tin oxide and mixtures thereof; wherein the heat reflective filter transmits 40-80% of light within the visible wavelengths (preferably 60-70%) and has a reflectance of less than 15%; wherein the color of both transmitted and reflected light from the heat reflect substrate is either neutral or is blue or green in color; and wherein the composite transmits less than about 7% of the infrared energy in light having a wavelength greater than about 1500 nm.

In another embodiment the heat reflecting film is a composite comprising in sequence: (a) a substantially transparent substrate; (b) a first outer dielectric layer; (c) an infrared reflecting metal layer; (d) a color correcting metal layer comprising a metal different from the infrared reflecting metal layer; (e) a protective metal layer comprising a metal different from the infrared reflecting metal layer and different from the color correcting layer; (f) a subcomposite comprising: (i) a subcomposite inner dielectric layer; (ii) a subcomposite infrared reflecting metal layer; (iii) a subcomposite color correcting metal layer comprising a metal different from the subcomposite infrared reflecting metal layer; and (iv) a subcomposite protective metal layer comprising a metal different from the subcomposite infrared reflecting metal layer and different from the subcomposite color correcting layer; and (g) a second outer dielectric layer; wherein the combined thickness $T_1$ of the infrared reflecting metal layer, the color correcting metal layer and the protecting metal layer is different than the combined thickness $T_2$ of the subcomposite infrared reflecting metal layer, the subcomposite color correcting metal layer and the subcomposite protecting metal layer, and wherein $T_1$ and $T_2$ are in a ratio to one another of about 1.2.

A preferred heat reflector film for use in this invention is made by sputter coating the following sequence of layers onto a PET film with UV absorbers dyed into it at 2.4 absorbance: a first layer of indium tin oxide about 30 nm thick coated on said PET film, a first layer of silver/copper alloy about 9 nm thick (92.5 wt. % Ag and 7.5 wt. % Cu) coated on said first layer of indium tin oxide, a layer of indium metal about 3 nm thick coated on said first silver/copper alloy, a first layer of titanium metal about 1 nm thick coated on said indium, a layer of indium tin oxide about 80 nm thick coated on said titanium, a second layer of silver/copper alloy about 9 nm thick (92.5 wt. % Ag and 7.5 wt. % Cu) coated on said indium tin oxide, a layer of indium metal about 2 nm thick coated on said second silver/copper alloy, a second layer of titanium metal about 1 nm thick coated on said 2 nm layer of indium, and a second layer of indium tin oxide about 30 nm thick coated on said second layer of titanium.

The layer of titanium functions as a protective sacrificial layer which prevents oxidation of the indium metal layer during the sputter coating of the indium tin oxide layer.

Alternatively the PET film may be eliminated and the above sequence of layers may be coated onto a component (e.g., glass) of window glazing.

The above preferred heat reflector has a sheet resistance which is less than 17 ohms/square.

Some embodiments of the invention utilize the metal or metal stack which comprises an electrically conductive metal such as copper optionally interposed between the two nickel/chrome layers as well as the heat reflecting sputtered metal/oxide stack.

When both of these filters are employed, they may be replaced by a filter having the electromagnetic filtering properties of the XIR-70 film or the XIR-75 film shown in table 3. The XIR-70 and XIR-75 films have an IR transmission at wavelengths between 780 nm and 2500 nm of no more than 50%, and preferably of less than 20%, and more preferably of about 15%. XIR-70 and XIR 75 films are commercially available from Southwall Technologies. XIR-70 film and the XIR-75 films are well known components of glass tint used in original equipment laminated automotive glass. Table 3 shows the characteristics of this type of tinted glass and, more particularly, table 3 shows the properties of XIR-70 film and XIR-75 film which may be used in the present invention as part of the overall combination of filters. An example of the XIR film may be about 2 mil. thick; have a visible light transmittance of about 60-70%, a visible reflectance (exterior) of about 9%; a total solar transmittance of about 46%; and a solar reflectance (exterior) of about 22%. The surface resistance of an exemplitive XIR-70 film used in this invention is about 6.0 ohms/square.

Preferably the XIR-70 or XIR-75 film further includes an electrically conductive metal layer (e.g., copper or silver) to produce a sheet resistance which is less than 4 ohms/square.

In a preferred embodiment, an improved anti-surveillance devices and system may be obtained by replacing the aforementioned metal stack (nickel chrome alloy/copper/nickel chrome alloy) and the heat reflecting metal/oxide stack with a high visible light transmission/low resistance (less than 4 ohms/square) filter in the combination of filters.

Most broadly the high visible light transmission/low resistance (less than 4 ohms/square) filter is a stack which is either an IR reflecting metal layer sandwiched between two dielectric layers or a dielectric layer sandwiched between two IR reflecting metal layers. The above-noted stack is coated onto a component of window glazing or onto a transparent plastic sheet such as PET.

The dielectric of each of the dielectric layers in the aforementioned stack has an index of refraction in the range of about 1.35 to about 2.6. Preferably the dielectric is a metal oxide dielectric having an index of refraction in the range of about 1.7 to about 2.6.

The above-described high visible light transmission/low resistance (less than 4 ohms/square) filter is preferably a Ag/Ti stack or a Ag/Au stack as described below.

The Ag/Ti stack may be a multilayered structure containing the following sequence of layers coated (preferably sputter coated) onto a component of window glazing or onto a transparent plastic sheet which is preferably polyethylene terephthalate (PET): 1. a layer of indium tin oxide which is preferably 30 nm thick; 2. a silver IR reflecting layer which is preferably about 9 nm thick; 3. a protective sacrificial layer of titanium about 1 nm thick; 4. a layer of indium tin oxide which is preferably about 70 nm thick; 5. a silver IR reflecting layer preferably about 9 nm thick; 6. a protective sacrificial layer of titanium preferably about 1 nm thick; 7. an indium tin oxide layer preferably about 70 nm thick; 8. a silver IR reflecting layer preferably about 9 nm thick; 9. a protective sacrificial layer of titanium preferably about 1 nm thick; and 10. a layer of indium tin oxide preferably about 30 nm thick.

The indium tin oxide layers in the Ag/Ti stack has an index of refraction of about 2.0. The thickness of the silver layers may be adjusted to achieve the desired ohms per square for the above-described multilayered structure. The above-described multi-layered structure has a sheet resistance which is less than 4 ohms per square.

Preferably the Ag/Ti stack has a sheet resistance which is less than 2.5 ohms/square. An Ag/Ti stack having a sheet resistance less than 2.5 ohms/square is exemplified by a stack containing the following sequence of layers sputtered onto a component of window glazing or onto a transparent plastic

TABLE 3

| Product/ Glass Type | Unit Thickness Si | Visible Light Transmittance (Tvis) % | Visible Reflectance Exterior % | Total Solar Transmittance (Tsol) % | Solar Reflectance Exterior % | Relative Heat Gain Btu's/Hr/ $Ft^2$ | Ultraviolet Blockage % |
|---|---|---|---|---|---|---|---|
| Clear Glass | 4 mil | 90 | 9 | 81 | 8 | 220 | 30 |
| Standard Auto Green Tint | 4 mil | 81 | 8 | 56 | 6 | 171 | 55 |
| Spectrally Absorbing Green | 4 mil | 74 | 7 | 44 | 5 | 150 | 70 |
| XIR 70 | 5 mil | 70 | 9 | 46 | 22 | 117 | >99 |
| XIR 75 | 5 mil | 75 | 11 | 52 | 23 | 135 | >99 |

Note:
XIR Glass construction is two plies of 2.1 mil clear glass with XIR-pvb interlayer.

sheet which is preferably PET: 1. a coating of indium tin oxide about 30 nm thick; 2. a silver IR reflecting layer which is about 11 nm thick; 3. a protective sacrificial layer of titanium about 1 nm thick; 4. a layer of indium tin oxide about 75 nm thick; 5. a silver IR reflecting layer which is about 13 nm thick; 6. a protective sacrificial layer of titanium about 1 nm thick; 7. an indium tin oxide layer about 70 nm thick; 8. a silver IR reflecting layer about 11 nm thick; 9. a protective sacrificial layer of titanium about 1 nm thick; and 10. a layer of indium tin oxide which is about 30 nm thick.

The Ag/Ti stack having the lower sheet resistance of less than 2.5 ohms per square provides lower electrical resistance, higher IR rejection at the 800 and above nm range with a visible light transmission of 70%. Using the Ag/Ti stack having a sheet resistance which is less than 2.5 ohms/square, results in a filter which is less dark, more conductive and which provides greater IR rejection compared to the filter containing the nickel-chrome alloy/copper/nickel-chrome alloy layered structure with the metal/oxide heat reflecting film.

The protective sacrificial layer of titanium will be oxidized to $TiO_2$ when the indium tin oxide layers are deposited to thereby prevent the indium tin oxide layer from oxidizing the silver.

The layers used in the Ag/Ti and Ag/Au stack may be sputter coated using any conventional sputter coating technique. For example the indium tin oxide layer in the Ag/Ti sputtered stack may be sputtered in an argon and oxygen environment and the metals in the Ag/Ti stack may be deposited in a pure argon environment.

The above described Ag/Ti stack has a visible light transmission (VLT) of about 65-69% $T_{550}$ (i.e., percentage of VLT measured using light having a wavelength of 550 nm).

The Ag/Au stack is also a multilayered structure coated (preferably sputter coated) onto a component of window glazing or onto a clear plastic sheet such as PET and preferably contains the following sequence of layers: 1. A layer of indium tin oxide (ITO) preferably about 30 nm thick; 2. a silver IR reflecting layer preferably about 9 nm thick; 3. a layer of gold about 1 nm thick; 4. an ITO layer preferably about 70 nm thick; 5. a silver IR reflecting layer preferably about 9 nm thick; 6. a layer of gold preferably about 1 nm thick; 7. an ITO layer preferably about 70 nm thick; 8. a silver IR reflecting layer preferably about 9 nm thick; 9. a gold layer preferably about 1 nm thick; 10. an ITO layer preferably about 30 nm thick.

The ITO layers in the above-described Ag/Au stack have a refractive index of about 2.0. The thickness of the silver layers may be varied to regulate the ohms per square for the above-described multilayered structure. The above-described multilayered structure has a sheet resistance which is less than 4 ohms per square.

The gold layers in the Ag/Au stack serve as a protective layer for the silver, but unlike the corresponding Ti layers in the Ag/Ti stack, the gold layers are not oxidized.

The ITO may be sputtered in an argon and oxygen environment while the metals may be deposited in a pure argon environment.

In both of the above described Ag/Ti and Ag/Au stacks, layer 1 (the first ITO layer) is first sputter coated onto a component of window glazing or onto the clear plastic sheet and the remaining layers 2-10 are sequentially sputter coated in the order indicated above.

In both of the above described Ag/Ti and Ag/Au stacks, any or all of the indium tin oxide layers may be substituted with any dielectric layer having an index of refraction in the range of about 1.35 to about 2.6, preferably a metal oxide dielectric having an index of refraction in the range of about 1.7 to about 2.6.

Another filter which may be used in the combination of filters is an IR absorbing filter which is a layer comprising an IR absorbing substance such as a layer of $LaB_6$ (lanthanum hexaboride) or other IR absorbing material such as antimony tin oxide. A preferred IR absorbing filter contains a combination of $LaB_6$ and antimony tin oxide. The IR absorbing material is preferably in the form of nanoparticles incorporated into a coating material such as adhesive or hardcoat material. Nanoparticles are particles having an average particle diameter of 200 nm or less, preferably less than 100 nm.

Examples of suitable IR absorbing filters include the IR absorbing filters described in United States published patent application no. U.S. Ser. No. 2002/0090507 A1 and WO 02/41041 A2, the specifications of which are incorporated herein by reference.

The IR absorbing filters described in WO 02/41041 A2 and U.S. Ser. No. 2002/0090507 A1 are optically active film composites which include a layer of resin binder having a thickness of less than 6 microns and a pencil hardness of at least 2H, preferably 3H, and include nanoparticles of at least one metallic compound absorbing light having a wavelength in the range of 1000-2500 nm and nanoparticles of a second metallic compound which is an inorganic compound and which absorbs light having a wavelength in the range of 700-1100 nm. Preferably the composite has a visible light transmission of at least 50% and a percent TSER of at least 35%, and more preferably has a visible light transmission of at least 70%. For a composite having a visible light transmission in the range of 50-60% the percent TSER may be between 50-65%.

Pencil hardness is measured according to ASTM D3363-92a.

Visible light transmission is calculated using CIE Standard Observer (CIE 1924 1931) and D65 Daylight.

The percent TSER is the percentage total solar energy rejection which is calculated from optical and heat rejection properties of coated film measured on a Varian Analytical Cary 5 Spectrophotometer in accordance with ASTM E903-82, the absorption and transmission data being analyzed using parameters described by Perry Moon in the Journal of the Franklin Institute, Volume 230, pp. 583-618 (1940).

Preferably one metallic compound is antimony tin oxide (ATO), indium tin oxide (ITO), or tin oxide.

Preferably said one metallic compound is ATO and the layer contains 30-60% by weight of ATO, preferably 50-60% by weight of ATO.

The second compound may be modified ITO as described in U.S. Pat. No. 5,807,511 and/or at least one of a metal hexaboride taken from the lanthanum series of the periodic table. The preferred hexaborides are La, Ce, Pr, Nd, Gb, Sm, and Eu with La being the most preferred option. The layer contains a maximum of 3% by weight of the second metallic compound, preferably less than 2% and more preferably between 0.5-2%.

The binder may be a thermoplastic resin such as an acrylic resin, a thermosetting resin such as an epoxy resin, an electron beam curing resin, or preferably a UV curable resin which may be an acrylate resin of the type disclosed in U.S. Pat. No. 4,557,980, or preferably a urethane acrylate resin.

The layer of resin binder may be coated to a transparent polymeric film substrate, preferably a polyester film which is more preferably PET film. The infrared blocking layer forms a hardcoat for the film substrate which is particularly advantageous and may cut out a further processing step during composite film manufacture. The PET film may be coated with an adhesive for fixing the film composite to the substrate used in this invention. The PET film and/or adhesive may include at least one UV radiation absorbing material to block out substantially all UV radiation to less than 1% weighted UV transmission. Weighted UV transmission is derived from measurements made in accordance with ASTM E-424 and as modified by the Association of Industrial Metallisers, Coaters & Laminators (AIMCAL). The above-mentioned IR absorption filter composites have low visible reflectivity of less than 10% and have excellent weatherability with no loss of absorption properties and holding color, after 1500 hours in a Weatherometer.

The IR absorbing filter may include a transparent substrate coated with a layer of resin having a thickness of less than 6 microns and which contains nanoparticles of ATO and nanoparticles of a second metallic compound which is an inorganic compound which absorbs light having a wavelength in the range of 700-1100 nm and a second transparent substrate located on the layer of resin so that the layer of resin is sandwiched between the two substrates.

Another filter which may be used in the combination of filters is a UV screening film. The UV screening film is advantageously a weatherable PET UV screening film which is preferably a PET film with UV absorbers dyed into it in an amount to produce at least 2.4 optical density (OD) absorbance. A suitable PET film includes the film manufactured by the dyeing process described in U.S. Pat. No. 6,221,112. One or two of the UV screening films may be used in the present invention. Instead of using a UV screening film, the UV absorbers may be incorporated into or on a component of window glazing.

Conventional museum grade film comprises the combination of two layers of the aforementioned UV screening film. Thus, the museum grade film may be substituted for any of the embodiments of this invention which include two UV screening films in the overall combination of filters.

Figure 11:
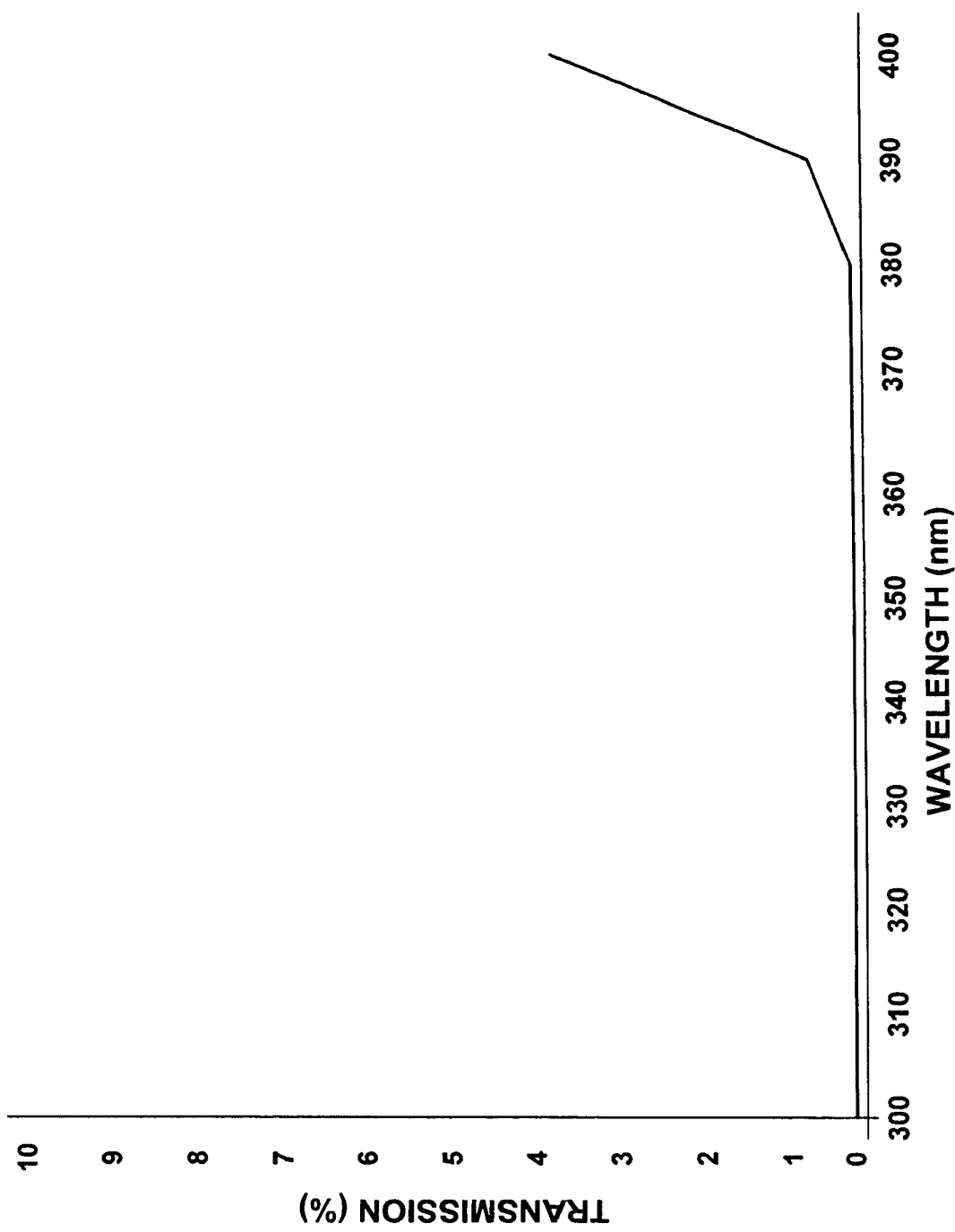
FIG. 11 is a graph which shows the light transmission properties (wavelengths from 300-400 nm) of a light filter used in the present invention.

The museum grade film has the wavelength transmission properties of FIG. 11. The museum grade film exhibits an increasing percentage of light transmission beginning about 380 nanometers as shown in FIG. 11. In one embodiment, the museum grade film exhibits light transmission percentages for various wavelengths as shown below in table 4.

TABLE 4

| Wavelength | Light Transmission |
| --- | --- |
| 320 nm | 0.1-0.3% |
| 380 nm | 0.4-0.5% |
| 400 nm | 3-5% |
| 550 nm | 85-88% |

A film having the properties shown in FIG. 11 and in table 4 may have a percent light transmission at 320 nm and 380 nm which is less that 1% of the transmission at 550 nm. In addition, the percent light transmission at 480 nm may be less than 50% of the transmission at 550 nm.

A flexible transparent sheet made in accordance with this invention may also be used to minimize acoustic transmissions from a building by carefully applying the film to the window with an adhesive while making certain that no visible air bubbles are formed between the flexible sheet and the glazing of the window. The term "visible air bubbles" used herein means air bubbles which are visible without any magnification (i.e., visible to the naked eye). It has been discovered that when the transparent flexible sheet lies over an air bubble, the flexible sheet behaves like the diaphragm of a loudspeaker. This causes unwanted transmission of sound waves. Avoiding these bubbles minimizes the transmission of the sound waves through the window.

The combination of filters used in this invention should cover the surface area of the entire window glazing or otherwise should be configured to minimize the passage of the selected wavelengths there-through unless the combination of filters is being used as a bag or tent. Thus, when the filters are applied to the glazing by adhering a flexible transparent sheet thereto, the flexible transparent sheet having the light filters thereon should be carefully positioned so that there are no gaps or unprotected areas on the glazing. In an embodiment, a single transparent flexible sheet having the filters thereon is employed to avoid seams between the edges of the flexible sheets on the glazing of a window. The avoidance of seams is beneficial because seams allow leakage of the wavelengths which the present invention seeks to avoid. This leakage through the seams occurs even when the edges of the flexible sheets are butted against one Another and even when the edges overlap one another.

Figure 5:
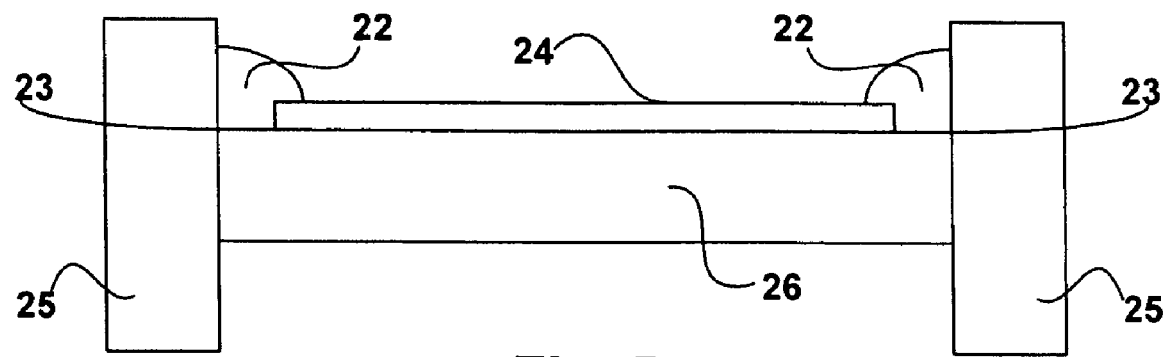
FIG. 5 is a cross-sectional view of an embodiment of the invention wherein sealant is used to cover any gaps between the edge of a flexible sheet of the invention and a window frame.

There is also a potential for leakage of the wavelengths around the periphery of the flexible sheet adjacent to the window frame. Turning to FIG. 5, leakage around the periphery may be minimized by applying an opaque electrically conductive sealant 22 around the periphery so that any gap 23 between the sheet 24 and the window frame 25 may be masked by the sealant. Thus, the sealant would cover any exposed portions of the glazing not covered by the sheet. FIG. 5 illustrates sheet 24 adhered to glazing 26 of a standard window. The sealant may be neutral curing to avoid unwanted chemical interaction with the sheet. An example of suitable sealant includes a silicone elastomer, such as Dow Corning 995 Silicone Structural Adhesive.

Preferably the flexible sheet is sized to avoid all gaps between sheet 24 and window frame 25. However it is not humanly possible to avoid all gaps between sheet 24 and window frame 25 due to small irregularities on the edges of sheet 24 and window frame 25. Thus sheet 24 should be sized so that the entire periphery of sheet 24 is in substantial contact with window frame 25. Substantial contact as used herein means as much contact as is humanly possible given the small irregularities on the edges of sheet 24 and window frame 25.

A first combination of filters used in the present invention comprises the above described low resistant sputtered stack (either the Ag/Ti or the Ag/Au stack or the stacks having the sequence: dielectric layer/IR reflecting metal layer/dielectric layer or the sequence: IR reflecting metal layer/dielectric layer/IR reflecting metal layer) in combination with one or two UV screening films. An example of the first improved combination of filters is illustrated in FIG. 6.

Figure 6:
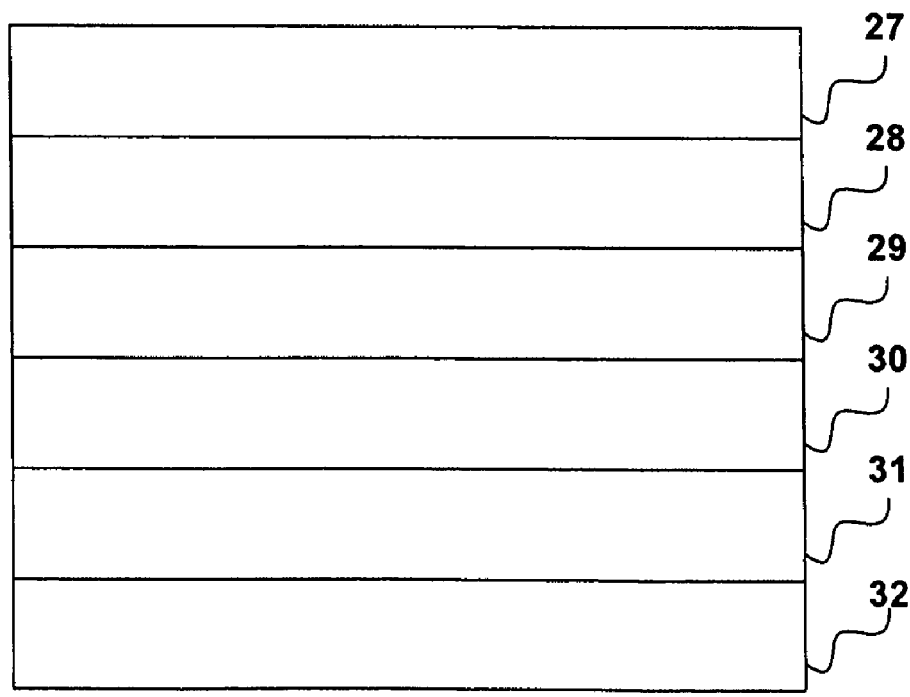
FIGS. 6-8 are cross-sectional views of embodiments of the invention.

Turning to FIG. 6, this embodiment of the invention includes layers 27-32. Layer 27 is an adhesive for adhesively securing the multilayered structure to glazing of a window or to the display screen of a plasma monitor or other type of display screen. Layer 28 is a UV screening film. Layer 29 is either the Ag/Ti or the Ag/Au low resistance (less than 4 ohms/square, preferably less than 2.5 ohms per square) sputtered stack as described herein. Layer 30 is a laminating adhesive. Layer 31 is either a clear film or a UV screening film. Layer 32 is an optional hardcoat layer.

The above-described first combination offers high visible light transmission and high EMI/RFI shielding attenuation. Thus the first combination may be applied to glazing of a window using adhesive layer 27 or may be adhered to the display screen of a plasma monitor or other display screen which emits large amounts of EMI/RFI, UV or IR.

The embodiment shown in FIG. 6 may be assembled using conventional film making, coating and laminating procedures. For example Ag/Ti stack of layer 29 is formed on film 28 by conventional sputtering and hardcoat layer 32 is applied onto layer 31 using conventional hardcoating techniques either before or after lamination of the remaining layers. The entire multilayered structure is assembled into a laminate using conventional laminating adhesives and adhesive layer 27 is applied using conventional adhesive coating technology.

A second combination of filters comprises the above-described Ag/Ti or the Ag/Au low resistance sputtered stack or the stacks having the sequence: dielectric layer/IR reflecting metal layer/dielectric layer or the sequence: IR reflecting metal layer/dielectric layer/IR reflecting metal layer, the above-described IR absorbing layer which preferably comprises $LaB_6$ and antimony tin oxide, and one or two UV screening films. An example of the second improved combination is illustrated in FIG. 7.

Figure 7:
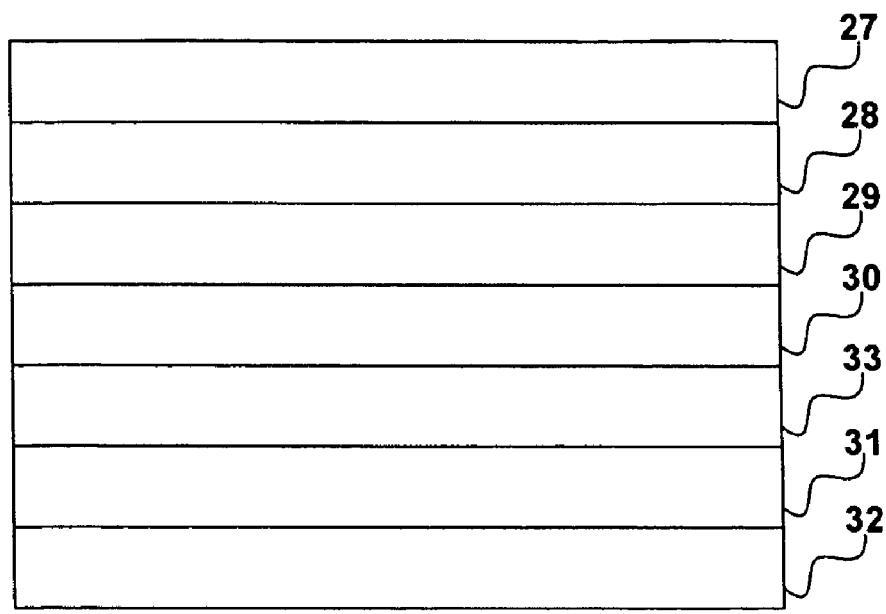

Turning to FIG. 7, this embodiment of the invention includes layers 27-33. Layers 27-32 may be the same material as layers 27-32 of FIG. 6. Layer 33 in FIG. 7 is the aforementioned IR absorbing layer which preferably comprises $LaB_6$ and antimony tin oxide.

The second combination of filters such as the combination of filters exemplified in FIG. 7 provides improved IR rejection at the near IR wavelength range due to the incorporation of layer 33 therein. In addition, the second combination provides high EMI/RFI shielding attenuation and provides standard and high UV rejection. Standard UV rejection is provided by the embodiments of FIGS. 6 and 7 wherein layer 31 is a clear film. Higher UV rejection is obtained when layer 31 is the UV screening film in the embodiment shown in FIGS. 6 and 7.

The example illustrated by FIG. 7 may be adhered to window glazing or to a plasma display screen or other type of display screen which emits large amounts of EMI/RFI or which emits large amounts of UV or IR light.

The embodiment shown in FIG. 7 may be assembled using the same conventional film making, coating and laminating procedures as described for the embodiment of FIG. 6 but which further includes coating a layer of IR absorbing material (e.g., a layer comprising $LaB_6$ and antimony tin oxide) onto film 31.

Figure 8:
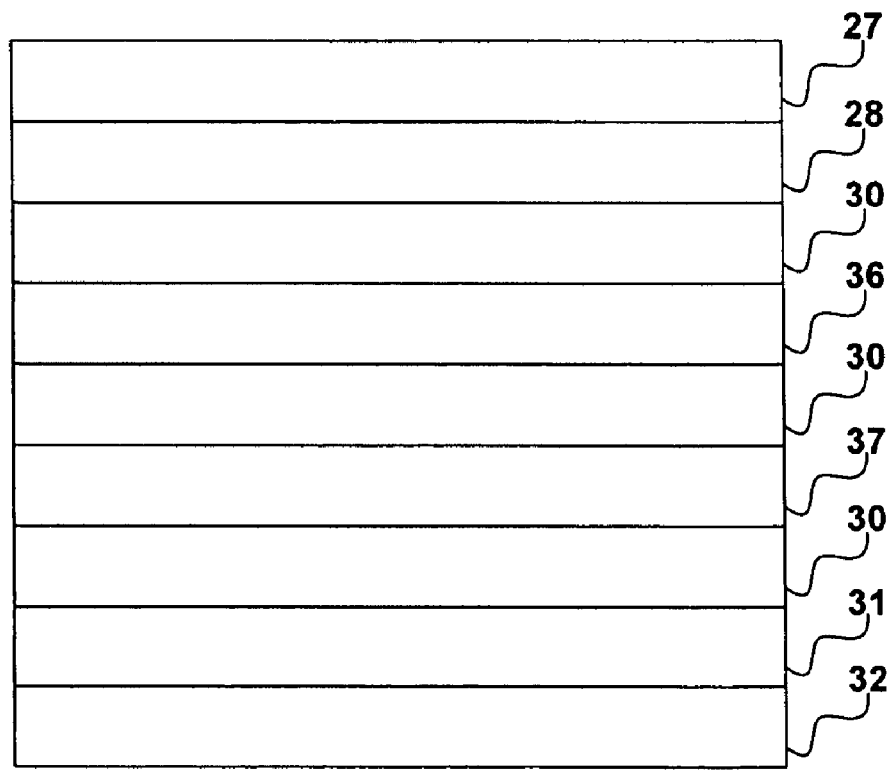

A third combination of filters utilized in this invention comprises the previously described sputtered metal or metal stack (electrically conductive metal such as copper optionally sandwiched between two corrosion protection layers), a heat reflecting sputtered stack (the previously described sputtered metal/oxide stack) and the UV screening material of layer 28 used in the example illustrated in FIG. 6. The third improved combination of filters is exemplified in FIG. 8 which includes the sequence of layers 27, 28, 30, 36, 30, 37, 30, 31 and 32. Layers 27, 28, 30, 31 and 32 in FIG. 8 are the same material as the corresponding numbered layers in the embodiment illustrated in FIG. 6. Layer 36 is the nickel/chrome alloy-copper-nickel/chrome alloy stack described herein. Preferably the nickel/chrome alloy is Hastelloy C276 alloy or the Inconel 600 alloy. Specific examples of Hastelloy C276 and Inconel 600 are described below:

Hastelloy C276 having the following mechanical properties: UTI tensil psi: 106,000; yield psi: 43,000; elong. % 71.0; and having the following chemical analysis as shown in Table 5:

TABLE 5

Hastelloy C 276

| Element | % by weight |
|---|---|
| C | .004 |
| Fe | 5.31 |
| Mo | 15.42 |
| Mn | 0.48 |
| Co | 1.70 |
| Cr | 15.40 |
| Si | .02 |
| S | .004 |
| P | .005 |
| W | 3.39 |
| V | 0.16 |
| Ni | Balance |

Inconel 600 having the following mechanical properties: UTI tensil psi: 139,500; yield psi 60,900; elong. % 44.0; hardness: Rb85; and having the following chemical analysis as shown in Table 6:

TABLE 6

INCONEL 600

| element | % by weight |
|---|---|
| C | .08 |
| Fe | 8.38 |
| Ti | 0.25 |
| Mn | 0.21 |
| Cu | 0.20 |
| Co | 0.05 |
| Cr | 15.71 |
| Si | 0.30 |
| S | <.001 |
| Al | 0.28 |
| P | 0.01 |
| Ni | 74.45 |
| Nb + Ta | 0.08 |

Layer 37 is a heat reflecting film. The heat reflecting film of layer 37 preferably includes a sputtered metal/oxide stack (described in U.S. Pat. No. 6,007,901) on a 1 mil. clear weatherable polyester (PET) film. The polyester film has UV absorbers dyed into it at at least 2.4 optical density absorbance. The film may be dyed using the dyeing process described in U.S. Pat. No. 6,221,112. Other films with UV screening capability may be used in place of the aforementioned UV screening film.

The embodiment shown in FIG. 8 is assembled using the same conventional techniques employed in making the embodiments of FIGS. 6 and 7. In particular, layer 36 is made by sputter coating the metal stack (copper layer interposed between two nickel/chrome alloy layers) onto a transparent plastic film such as a 1 mil PET film. Layer 37 is formed by sputter coating the metal-oxide stack onto a 1 mil clear weatherable PET film with UV absorbers dyed into it to produce at least 2.4 optical density absorbance. Layers 36 and 37 along with films 28 and 31 are laminated together using the laminating adhesive layers 30, and adhesive layer 27 is applied using conventional adhesive coating technology. Optional hardcoat layer 32 may be applied to film 31 using conventional hardcoat coating techniques either before or after lamination of the remaining layers.

Figure 9:
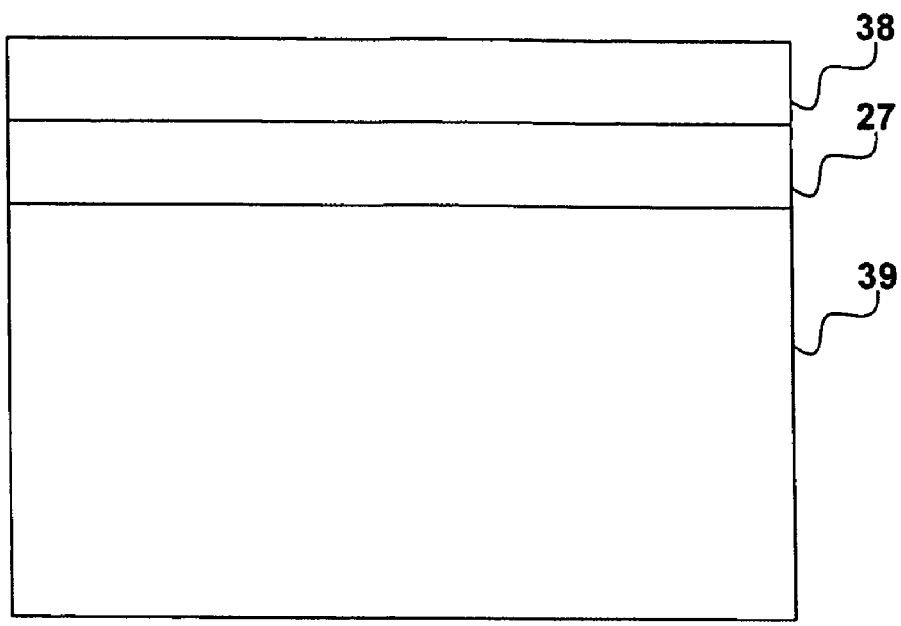
FIG. 9 is a cross-sectional view of the embodiments of the invention which includes a temporary release liner.
Figure 10:
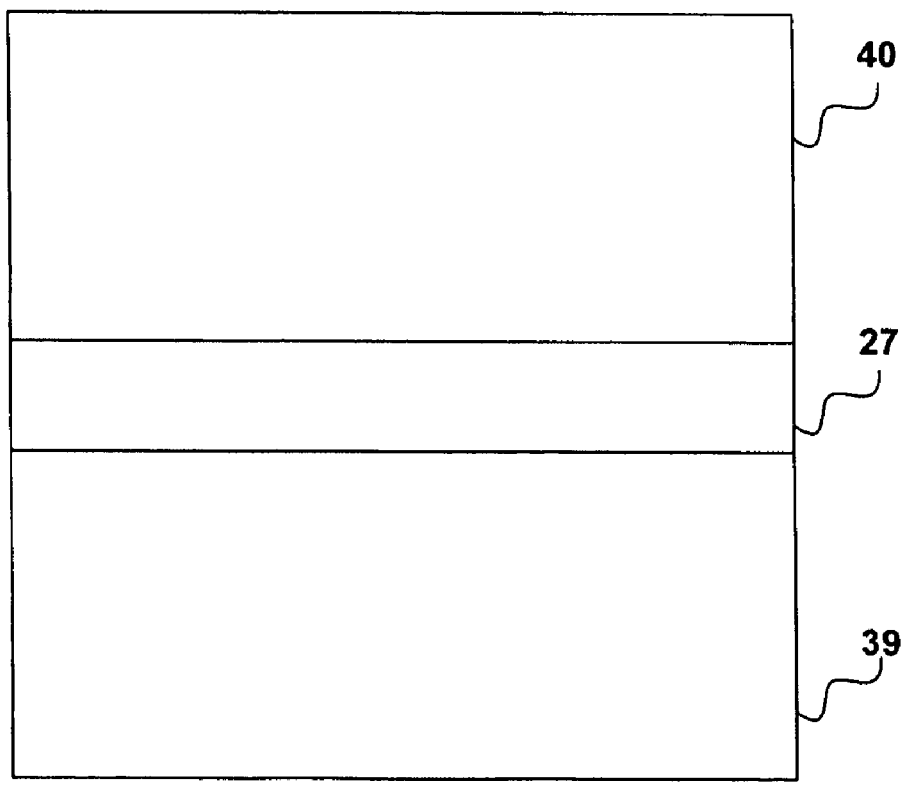
FIG. 10 is a cross sectional view of the embodiments of the invention wherein the combination of light filters are adhered to a window or other surface after removal of a release liner.

Each of the embodiments of the invention illustrated in FIGS. 6-8 advantageously includes a temporary release liner which covers an exposed surface of adhesive layer 27. FIG. 9 illustrates the location of release liner 38 secured to adhesive layer 27. Reference numeral 39 in FIG. 9 represents the various layers located below adhesive layer 27 in the embodiments shown in FIGS. 6-8. Removal of release liner 38 exposes adhesive layer 27 and thereby allows the combination of filters to be adhesively secured to a desired substrate 40 such as the glazing of a window or the screen of a computer monitor as illustrated in FIG. 10. A mechanical fastener may be used in place of an adhesive for securing the various embodiments of the invention to the screen of a computer monitor.

The release liner 38 used in the various embodiments of this invention may be any conventional release liner known to those skilled in the art. For example, the release liner may be a 1 mil PET film with a silicone release coating thereon. Any suitable silicone release coating may be used, such as a tin catalyzed silicone release which has about 10 grams per inch release characteristic. Non-silicone release formulations may be substituted for the silicone release layer.

The adhesive layer 27 used in the various embodiments of this invention may be any adhesive known to those skilled in the art for attaching a plastic sheet to glass. Pressure sensitive adhesives are particularly suitable for this purpose. A non-pressure sensitive adhesive which may be used is advantageously a clear distortion free adhesive such as a functional polyester based adhesive having siloxane functionality which provides a strong bond to glass.

An example of a pressure sensitive adhesive includes an acrylic solvent based pressure sensitive adhesive which is applied at about 10 lb./ream coat weight. The pressure sensitive adhesive of layer 27 may include 4% by weight of a UV absorber such as a benzotriazole UV absorber. Such a pressure sensitive adhesive is commercially available as National Starch 80-1057. Other adhesives or adhesive types may be substituted for the PSA adhesive as can other types of UV absorbers. It should be appreciated by one of ordinary skill in the art that these UV absorbers function as stabilizers, and may be added to the present invention to protect the adhesive from deterioration (e.g., deterioration caused by sunlight). These stabilizers, however, are not required to practice the invention.

The adhesive layer such as layer 27 may be omitted if the combination of filters is in the form of a flexible bag or a tent.

Layer 28 used in the various embodiments of this invention is a weatherable PET UV screening film which is preferably a PET film with UV absorbers dyed into it at at least 2.4 optical density (OD) absorbance. A suitable PET film for layer 28 includes the film manufactured by the dyeing process described in U.S. Pat. No. 6,221,112. Other films with similar UV screening capability may be substituted for the above-described film used in layer 28.

The thickness of the PET film used to make layer 28 may be varied. For example, the film used in layer 28 in FIGS. 6 and 7 is desirably 1 mil thick to provide sufficient support for other layers used in the overall structure. The thickness of layer 28 in FIG. 8 may be 0.5 mil thick.

The low resistance sputtered stack of layer 29 used in the various embodiments of this invention may be either the Ag/Ti or the Ag/Au stack as described herein or a similar configuration on a PET clear substrate. The low resistance stack provides higher visible light transmission.

The laminating adhesive layer 30 used in the various embodiments of the invention may be any conventional laminating adhesive including pressure sensitive adhesives known to those skilled in the art of the technological area of this invention. A useful laminating adhesive includes any conventional polyester adhesive with an isocyanate cross-linker added thereto. An example of such a laminating adhesive is Rohm and Haas' Adcote 76R36 adhesive with catalyst 9H1H. The adhesive may be applied at 1-1.5 lb. per ream coat weight. Other laminating adhesives may be substituted for the above-noted polyester-type adhesive.

Layer 31 used in the various embodiments of this invention is a clear plastic film such as clear PET which is optionally provided with a UV screening capability as described above with respect to layer 28. Thus, the clear PET layer 31 is preferably a clear PET film which optionally has UV absorbers dyed into it at at least 2.4 OD absorbance. The thickness of the PET film used in layer 31 may be varied. For example, the PET film used in layer 31 of FIGS. 6 and 8 may be 0.5 mil thick. The PET of layer 31 in FIG. 7 may be 0.5 or 1 mil thick. Also, layer 31 in FIG. 8 is clear PET film without UV absorbers dyed into it. The PET of layer 31 in FIGS. 6 and 7 may be either the clear PET without the UV absorbers dyed into it or may be the clear PET with UV absorbers dyed into it at at least 2.4 OD absorbance. The "2.4 absorbance" referred to herein is measured at 358 nm wavelength.

The hardcoat layer 32 used in the various embodiments of this invention may be formed from any of the hardcoat materials described herein or from any other conventional hardcoat material. Layer 32 used in the various embodiments of this invention is preferably 1-2 microns thick. The hardcoat is used to protect the combination of filters from damage and therefore the hardcoat may be omitted when the combination of filters is in a protected area where damage is not likely to occur. A suitable hardcoat composition includes the hardcoat described in U.S. Pat. No. 4,557,980; the specification of which is incorporated herein by reference.

Layer 33 used in the various embodiments of this invention is the aforementioned IR absorbing layer which preferably comprises $LaB_6$ and antimony tin oxide as a coating or film.

Layer 36 used in the various embodiments of this invention may be a 1 mil PET film or a functionally equivalent plastic film with a sputtered heat reflecting-conductive metal stack coating made up of a copper layer interposed between two nickel/chrome alloy layers. Layer 36 has a visible light transmission of about 35%. The nickel/chrome alloy layers are preferably Hastelloy C276 or Inconel 600. Layer 36 which includes the film with the metal stack deposited thereon, preferably has a sheet resistance which is less than 8 ohms per square.

Layer 37 used in the various embodiments of this invention is a heat reflecting film which preferably includes the above-described sputtered metal/oxide stack (described in U.S. Pat. No. 6,007,901) on a 1 mil clear weatherable polyester (PET) film. The polyester film has UV absorbers dyed into it at at least 2.4 OD UV absorbance (2.4 OD UV absorbing PET). The film may be dyed using the dyeing process described in U.S. Pat. No. 6,221,112. Other films with similar UV screening capability may be used in place of the aforementioned UV screening film.

According to a preferred embodiment, two spaced apart filter combinations are utilized in combination with a window glazing unit to provide enhanced security. For example, a film comprising a combination of filters may be adhered to each side of a glazing unit (e.g., glass or plastic glazing) or one film comprising a combination of filters may be adhered to each of two spaced apart transparent sheets of a glazing unit. Alternatively, two spaced apart films each of which comprises a combination of filters may be spaced apart within the space located between two spaced apart transparent sheets of a glazing unit.

In a preferred embodiment of the spaced apart filter combinations, each of the filter combinations are embedded. (preferably completely embedded) within a PVB interlayer of a glazing unit which includes at least one PVB layer interposed between two transparent sheets of glazing material (e.g., glass or plastic). More preferably one filter combination is embedded in a first PVB interlayer and another filter combination is embedded in a second PVB interlayer spaced apart from the first PVB interlayer. An example of this more preferred embodiment is illustrated in FIGS. 12 and 13.

Figure 12:
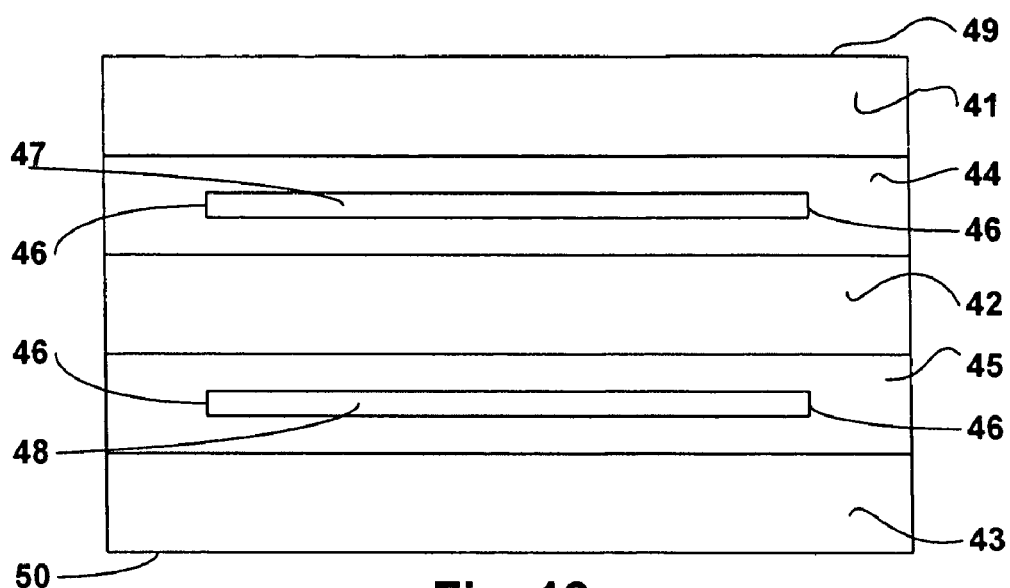
FIG. 12 is a cross-sectional view of an embodiment of the invention wherein the filter combination is embedded within PVB layers which are interposed between multiple glass layers.
Figure 13:
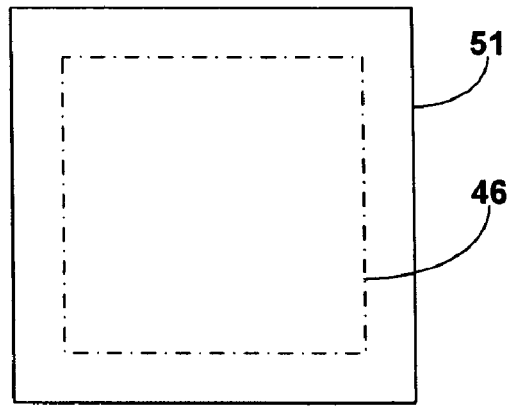
FIG. 13 is a top view of the embodiment depicted in FIG. 12.

The embodiment depicted in FIG. 12 includes front and rear surfaces 49 and 50, glass layers 41, 42 and 43 with PVB interlayer 44 interposed between glass layers 41 and 42 and PVB interlayer 45 interposed between glass layers 42 and 43. The PVB layers 44 and 45 fill the gap between the glass sheets and include films 47 and 48 embedded therein. Films 47 and 48 comprise any of the above-described filter combinations as a component thereof. Preferably each edge 46 of films 47 and 48 lie within the PVB so that the edges are not exposed to water, oxygen or other corrosive or harmful environmental conditions. The edges, being embedded within the PVB interlayer, thereby produce a "picture frame" configuration as shown in FIG. 13 wherein the edge 46 of film 47 (and likewise edge 46 of film 48) is spaced apart from the edge 51 of the entire structure.

The PVB layers are conventionally used in window manufacturing and serve to adhere the glass sheets to form a laminate which functions as a safety glass. The PVB layers used in this invention may be substituted with other similar plastic laminating layers such as polyurethane. The preferred glass layers may be substituted with other window glazing materials such as polycarbonate and polyacrylics. Thus the embodiment depicted in FIG. 12 may use alternating layers of glass, polycarbonate and polyacrylic instead of the three glass layers.

Figure 15:
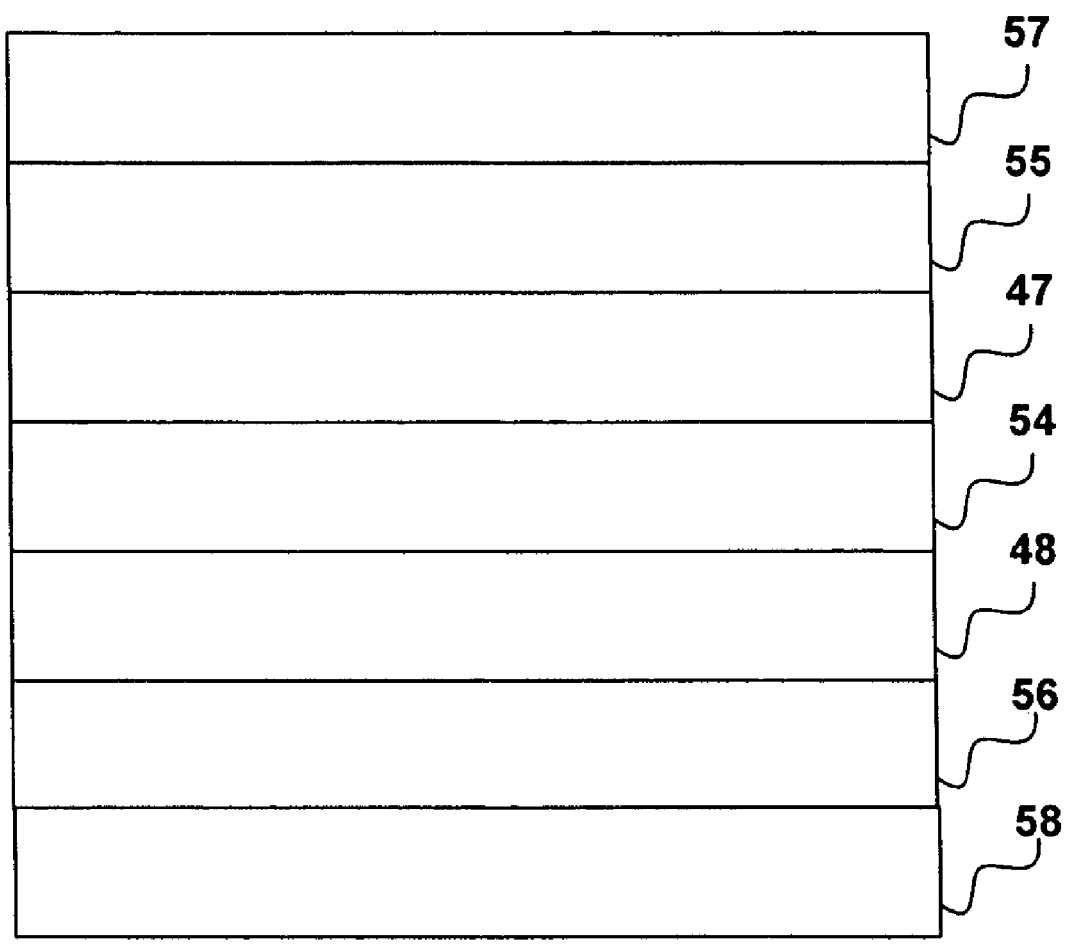
FIG. 15 is a cross-sectional view of an embodiment of the invention which includes two spaced apart filter combinations.

Another embodiment of the invention which utilizes two spaced apart filter combinations is illustrated in FIG. 15. The embodiment shown in FIG. 15 is glazing for a window and includes therein two spaced apart films 47 and 48 which comprise any of the filter combinations described herein. Layer 54 adhesively secures film 47 to film 48. Layer 54 may be a conventional safety glass interlayer such as PVB or the like. Alternatively layer 54 may be an adhesive layer. An adhesive layer is advantageously used in place of the PVB for layer 54 in situations where the spacing between films 47 and 48 is smaller than the smallest spacing which would be permitted when PVB is used to adhesively secure films 47 and 48. This is because PVB generally requires a relatively thick application to form layer 54 whereas adhesives can be applied in thin layers to produce a narrow spacing between films 47 and 48 and the thickness of the adhesive can be adjusted to regulate the spacing.

The PVB or adhesive of interlayer 54 may be electrically conductive. Electrical conductivity may be achieved by any known technique such as by the incorporation of electrically conductive particles therein.

The embodiment shown in FIG. 15 also includes conventional interlayers 55 and 56 made of PVB or the like and glass sheets 57 and 58 on the outer surfaces thereof.

Figure 14:
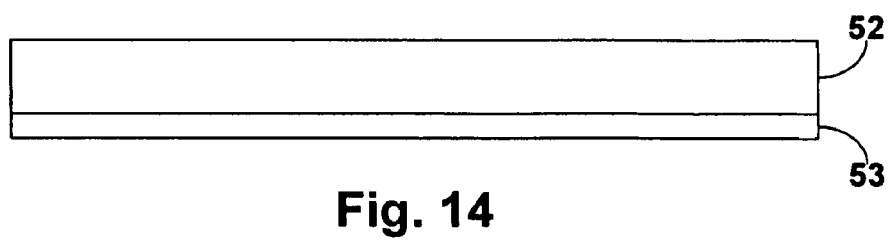
FIG. 14 is a cross-sectional view of the embodiment of the invention which employs a glass-fragmentation safety shield as a component thereof.

FIG. 14 depicts an embodiment of the invention which includes a glass substrate connected to any of the filter combinations of the invention with a glass fragmentation safety film adhered thereto. In FIG. 14 reference numeral 52 represents the combination of a glass substrate connected to any of the filter combinations of the invention and reference numeral 53 represents a flexible plastic film such as PET film adhesively secured to the combination 52.

The embodiments described herein include instances where the filters or combination of filters are applied onto a film such as a plastic film which in turn is adhered to window glazing. However it is within the scope of this invention to omit the film or films used for any filter or combination of filters and apply the filter or combination of filters onto or within a component of window glazing.

As described above, the present invention provides various combinations of films layers, such as layers 1, 2 and 3, in order to accomplish desired selective filtering of various bands of electromagnetic radiation. Specifically, it can be seen that embodiments of the present invention provides a combination of two or more filters connected to a substrate, such as glass, to block the passage of selected bands of electromagnetic radiation. In other words, the films layer combinations disclosed in the present invention have a particular desired function of preventing unwanted electromagnetic emissions from exiting an enclosure while still allowing the passage of certain desired electromagnetic radiations. As previously described, the disclosed film combinations have particular application in anti-surveillance security for preventing or attenuating the passage of electromagnetic wavelengths which pose a security risk. Thus, a building may be secure from surveillance while still allowing natural light and other desired wavelengths to enter or exit the building. Furthermore, an existing building may be retrofitted through the use of specialized films layer combinations to make the existing building more secure against surveillance without requiring extensive reconfiguration, such as the removal of windows and other radiation portals.

Figure 16:
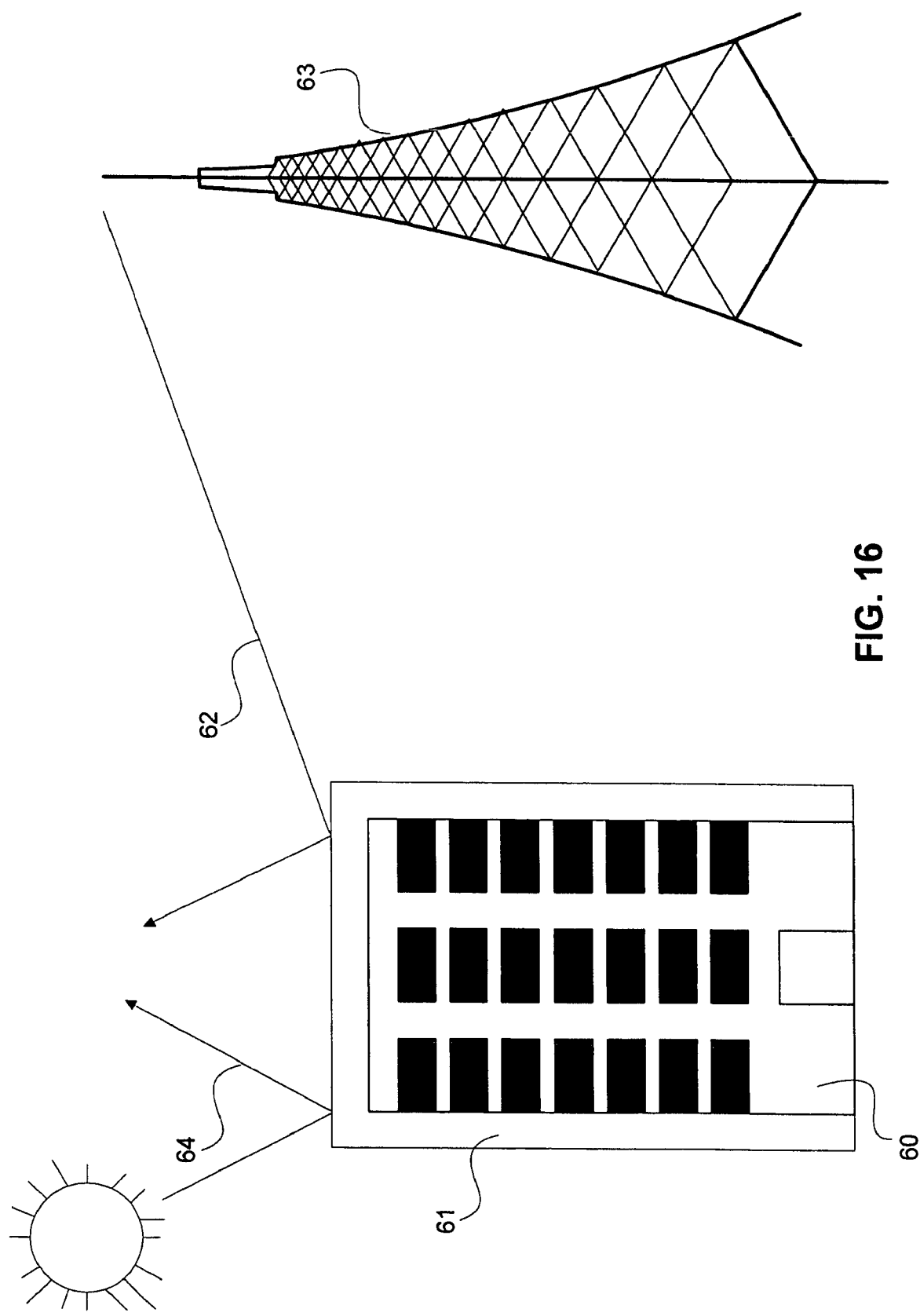
FIG. 16. depicts the use of the film layers to prevent unwanted emission from entering an enclosure in accordance with embodiments of the present invention.

In another embodiment of the present invention, a film having a combination of filtering layers may be used to selectively control the entrance of types of radiation into an enclosure. Referring now to FIG. 16, a filtering film 61 is applied to a building 60 using various techniques. For example, as described above, the filtering film 61 may be applied as needed using specialized conductive glazing or other adhesives to the glass surfaces of the building 60. The filtering film 61 comprises a combination of layers, such as those described above in FIG. 1-15 and the associated text, where the layers of the filtering film 61 are chosen as needed to block the entrance of undesired types of radiations into the building 60.

In a preferred embodiment of the present invention, the filtering film 61 is a combination of two or more filters connected to a substrate, such as glass. One of the filters screens UV light. Another filter in the combination generally has (1) a heat reflecting component and an electrically conductive metal component, (2) a component having an IR transmission at wavelengths between 780 nm and 2500 nm of no more than 50%, or (c) a component which has a sheet resistance of less than 4 ohms per square and comprises a sequence of layers. These layers generally include a combination of dielectric layer and IR reflecting metal layers wherein the dielectric of each dielectric layer has an index of refraction in the range of about 1.35 to 2.6. In this way, the filtering film blocks or attenuates UV, IR and radiowave radiation.

Referring again to FIG. 16, the filtering film 61 may be adapted as needed to prevent the entrance of unwanted manmade radiation 62 such as radio waves from a transmission source 63 and to prevent the entrance of unwanted ambient radiation 64 from a natural source such as the sun.

The blocking or attenuation of unwanted radiations 62 and 64 is very desirable. From a general public health standpoint, the blocking or attenuation of the unwanted radiations 62 and 64 protects workers and occupants of the building 60 from maladies associated with exposure to the unwanted radiations. This consideration is becoming more important in newer constructions methods, such as "green architecture." A green building places a high priority on health, environmental and resource conservation performance over its life-cycle.

Green design emphasizes a number of new environmental, resource and occupant health concerns including reducing human exposure to noxious materials and conserving energy. To achieve these goals, green buildings are typically more open to the environment, such as using increased window surface areas to achieve greater ambient lighting and heating, as well as to create a more pleasant interior environment. While the new construction methods allow greater entrance of desired radiation, the exposure of occupants in the building 60 to unwanted radiation 62 and 64 also increase as well, thereby posing potential exposure-related health risks to these occupants.

There are also practical considerations for preventing unwanted radiations 62 and 64 from entering the building 60 because these unwanted radiations 62 and 64 have harmful effects to the building 60 and the equipment contained in the building 60. For example, wireless computer networks using radio waves are increasingly common, and the functioning of these networks is adversely effected by the unwanted RFI in the unwanted radiations 62 and 64. Similarly, other bands of radiation, such as UV energy have adverse effects on equipment in building 60.

As disclosed above, the various combinations of the films disclosed in the present invention may be used in the filtering film 61 as needed to block or attenuate the unwanted radiations 62 and 64 while still allowing the transmission of visible light and other desired radiation, such as needed to accomplish desired benefits of the green architecture. Where needed, the composition of the filtering film 61 and the connection method of the filtering film 61 to the building 60 may be adjusted as described herein to selectively admit various desired radiation bandwidths.

The foregoing description of the preferred embodiments of the invention has been presented for the purposes of illustration and description. It is not intended to be exhaustive or to limit the invention to the precise form disclosed. Many modifications and variations are possible in light of the above teaching. It is intended that the scope of the invention be limited not by this detailed description, but rather by the claims appended hereto. Many embodiments of the invention can be made without departing from the spirit and scope of the invention.

What is claimed:

1. A method for preventing or attenuating the passage of unwanted electromagnetic wavelengths into an enclosure, the enclosure comprising at least one transparent area comprising a transparent substrate, the method comprising the step of applying a combination of filters to said substrate, said combination of filters comprising a first light filter and a second light filter which screens UV light, wherein said first light filter is: a light filter (a) comprising a heat reflecting layer and an electrically conductive metal layer, or a light filter (b) having an IR transmission at wavelengths between 780 nm and 2500 nm of no more than 50%, or a light filter (c) which has a sheet resistance of less than 4 ohms per square and comprises a sequence of layers: dielectric layer/IR reflecting metal layer/dielectric layer; or IR reflecting metal layer/dielectric layer/IR reflecting metal layer, wherein said sequence of layers is coated onto said substrate or onto a transparent plastic sheet; said combination of filters being configured to prevent or attenuate the passage of said electromagnetic wavelengths through said apparatus and said dielectric of each dielectric layer has an index of refraction in the range of about 1.35 to 2.6.

2. The method of claim 1, wherein said electrically conductive metal layer of light filter (a) has at least the electrical conductivity of aluminum; said dielectric of each dielectric layer of filter (c) is a metal oxide having an index of refraction in the range of about 1.7-2.6; and said IR reflecting metal is silver.

3. The method of claim 2, wherein said electrically conductive metal layer of light filter (a) is copper; and light filter (c) comprises an Ag/Ti sputtered stack or a Ag/Au sputtered stack, wherein: said Ag/Ti sputtered stack has a sheet resistance less than 4 ohms/square and is made by sputter coating the following sequence of layers onto said substrate or onto a transparent plastic sheet: 1) a layer of metal oxide, 2) a silver IR reflecting layer, 3) a protective sacrificial layer of titanium, 4) a layer of metal oxide, 5) a silver IR reflecting layer, 6) a protective sacrificial layer of titanium, 7) a metal oxide layer, 8) a silver IR reflecting layer, 9) a protective sacrificial layer of titanium, 10) a layer of metal oxide; said Ag/Au sputtered stack has a sheet resistance less than 4 ohms/square and is made by sputter coating the following sequence of layers onto said substrate or onto a transparent plastic sheet: 1) a layer of metal oxide, 2) a silver IR reflecting layer, 3) a layer of gold, 4) a layer of metal oxide, 5) a silver IR reflecting layer, 6) a layer of gold, 7) a layer of metal oxide, 8) a silver IR reflecting layer, 9) a gold layer, and 10) a layer of metal oxide.

4. The method of claim 3, wherein said heat reflecting layer comprises a plurality of heat reflecting metal layers and a plurality of dielectric layers; and, wherein: said light filter (b) has a sheet resistance less than 4 ohms/square and comprises a film which exhibits a visible light transmittance of about 60-70% a visible reflectance of about 9%, a total solar transmittance of about 46% and a solar reflectance of about 22%; and, wherein: said sequence of layers of said sputtered Ag/Ti stack is made by coating the following sequence of layers onto said transparent plastic sheet: 1) a layer of indium tin oxide about 30 nm thick, 2) a silver IR reflecting layer about 9 nm thick, 3) a protective sacrificial layer of titanium about 1 nm thick, 4) a layer of indium tin oxide about 70 nm thick, 5) a silver IR reflecting layer about 9 nm thick, 6) a protective sacrificial layer of titanium about 1 nm thick, 7) an indium tin oxide layer about 70 nm thick, 8) a silver IR reflecting layer about 9 nm thick, 9) a protective sacrificial layer of titanium about 1 nm thick, and 10) a layer of indium tin oxide about 30 nm thick; and, wherein: said sequence of layers of said sputtered Ag/Au comprises the following sequence of layers coated onto said transparent plastic sheet: 1) a layer of indium tin oxide about 30 nm thick, 2) a silver IR reflecting layer about 9 nm thick, 3) a layer of gold about 1 nm thick, 4) an ITO layer about 70 nm thick, 5) a silver IR reflecting layer about 9 nm thick, 6) a layer of gold about 1 nm thick, 7) an ITO layer about 70 nm thick, 8) a silver IR reflecting layer about 9 nm thick, 9) a gold layer about 1 nm thick, and 10) an ITO layer about 30 nm thick; and, wherein: said second light filter comprises one or two PET films with UV absorbers dyed therein in an amount to produce at least 2.4 optical density absorbance in each PET film; and, wherein: said copper layer is sandwiched between two corrosion protection metal or metal alloy layers which protect said copper layer from corrosion.

5. The method of claim 4, wherein said heat reflecting layer is a film made by sputter coating the following sequence of layers onto a transparent plastic film with UV absorbers dyed therein at 2.4 optical density absorbance: 1) a layer of indium tin oxide about 30 nm thick, 2) a layer of Ag/Cu alloy about 9 nm thick, 3) a layer of indium metal about 3 nm thick, 4) a layer of titanium metal about 1 nm thick, 5) a layer of indium tin oxide about 80 nm thick, 6) a layer of Ag/Cu alloy about 9 nm thick, 7) a layer of indium metal about 2 nm thick, 8) a layer of titanium metal about 1 nm thick, and 9) a layer of indium tin oxide about 30 nm thick.

6. The method of claim 4, wherein said first light filter is said Ag/Ti stack.

7. The method of claim 6, wherein said combination of filters further comprises said IR absorbing filter as an additional light filter, wherein said IR absorbing filter is a layer which comprises $LaB_6$ and antimony tin oxide.

8. The method of claim 4, wherein said second light filter comprises two of said PET films with said UV absorbers dyed therein.

9. The method of claim 8, wherein said second light filter has the wavelength transmission properties of FIG. 11.

10. The method of claim 9, wherein said second light filter has a wavelength light transmission at a wavelength of 320 nm of substantially 0.1% to 0.3%, a wavelength light transmission at a wavelength of 380 nm of substantially 0.4% to 0.5%, a wavelength light transmission at a wavelength of 400 nm of substantially 3% to 5%, and a wavelength light transmission at a wavelength of 550 nm of substantially 85% to 88%.

11. The method of claim 3, wherein said first light filter is said Ag/Ti sputtered stack or said Ag/Au sputtered stack and said second light filter comprises one or two PET films with UV absorbers dyed therein in an amount to produce at least 2.4 optical density absorbance in each PET film.

12. The method of claim 11, wherein said first light filter is said Ag/Ti sputtered stack, wherein said Ag/Ti sputtered stack has a sheet resistance less than 2.5 ohms per square and is made by sputter coating the following sequence of layers onto a transparent plastic sheet: 1) a layer of indium tin oxide about 30 nm thick, 2) a silver IR reflecting layer about 11 nm thick, 3) a protective sacrificial layer of titanium about 1 nm thick, 4) a layer of indium tin oxide about 75 nm thick, 5) a silver IR reflecting layer about 13 nm thick, 6) a protective sacrificial layer of titanium about 1 nm thick, 7) an indium tin oxide layer about 70 nm thick, 8) a silver IR reflecting layer about 11 nm thick, 9) a protective sacrificial layer of titanium about 1 nm thick, and 10) a layer of indium tin oxide about 30 nm thick.

13. The method of claim 12, wherein said combination of filters further comprises said IR absorbing layer as an additional light filter, wherein said IR absorbing filter is a layer which comprises $LaB_6$ and antimony tin oxide.

14. The method of claim 3, wherein said first light filter is light filter (a) comprising said heat reflecting layer and said copper layer is interposed between two nickel/chrome alloy layers; and said second light filter comprises one or two PET films with UV absorbers dyed therein in an amount to produce at least 2.4 optical density absorbance in each PET film.

15. The method of claim 14, wherein said second light filter comprises two of said PET films with said UV absorbers dyed therein.

16. The method of claim 15, wherein said heat reflecting layer is a film made by sputter coating the following sequence of layers onto a PET film with UV absorbers dyed therein to produce at least 2.4 optical density absorbance: 1) a layer of indium tin oxide about 30 nm thick, 2) a layer of Ag/Cu alloy about 9 nm thick, 3) a layer of indium metal about 3 nm thick, 4) a layer of titanium metal about 1 nm thick, 5) a layer of indium tin oxide about 80 nm thick, 6) a layer of Ag/Cu alloy about 9 nm thick, 7) a layer of indium metal about 2 nm thick, 8) a layer of titanium metal about 1 nm thick, and 9) a layer of indium tin oxide about 30 nm thick.

17. The method of claim 3, wherein said substrate is configured as a tent.

18. The method of claim 3, wherein said substrate is configured as a bag.

19. The method of claim 3, wherein said substrate comprises a flexible transparent sheet configured for attachment to glazing of a window.

20. The method of claim 19, wherein the transparent substrate further comprises a window with said flexible transparent sheet adhered to glazing of said window.

21. The method of claim 19, wherein said flexible transparent sheet is adhered to said glazing of said window with an adhesive, wherein visible air bubbles are excluded between said transparent sheet and said glazing.

22. The method of claim 3, wherein said substrate comprises glazing of a window.

23. The method of claim 22, wherein said combination of filters further comprises a safety film adhered to said glazing.

24. The method of claim 22, wherein said combination of filters further comprises a spaced apart combination of filters comprising a first and a second combinations of filters, said first and said second combinations of filters being spaced apart from each other.

25. The method of claim 24, wherein the first and said second combinations of filters are adhered to each other by an electrically conductive adhesive or an electrically conductive layer of PVB.

26. The method of claim 24, wherein each of the first and said second combinations of filters is embedded in spaced apart layers of polyvinylbutyral, wherein each polyvinylbutyral layer is sandwiched between layers of glass or plastic window glazing.

27. The method of claim 24, wherein said combination of filters comprises an upper layer comprising a first glass sheet joined to the first combination of filters by a layer of PVB; a lower layer comprising a second glass sheet joined to the second combination of filters by a second layer of PVB; said first and second combination of filters being adhesively secured to each other by a third layer of PVB or by an adhesive layer; said third layer of PVB and said adhesive having a thickness which determines a distance between said spaced apart combination of filters.

28. The method of claim 27, wherein said third layer of PVB or said adhesive is electrically conductive.

\* \* \* \* \*